United States Patent
Fang et al.

(10) Patent No.: US 11,231,603 B2
(45) Date of Patent: Jan. 25, 2022

(54) GSST AND APPLICATIONS IN OPTICAL DEVICES

(71) Applicant: Massachusetts Institute of Technology, Cambridge, MA (US)

(72) Inventors: Zhuoran Fang, Guangdong (CN); Tian Gu, Fairfax, VA (US); Juejun Hu, Newton, MA (US); Junying Li, Somerville, MA (US); Yifei Zhang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/826,489

(22) Filed: Mar. 23, 2020

(65) Prior Publication Data

US 2020/0285083 A1     Sep. 10, 2020

Related U.S. Application Data

(62) Division of application No. 15/941,879, filed on Mar. 30, 2018, now Pat. No. 10,634,938.

(Continued)

(51) Int. Cl.
  *G02F 1/01*     (2006.01)
  *C22C 30/00*    (2006.01)
(Continued)

(52) U.S. Cl.
  CPC .......... *G02F 1/0147* (2013.01); *C22C 30/00* (2013.01); *C23C 14/0623* (2013.01);
(Continued)

(58) Field of Classification Search
  CPC ............... G02F 1/0147; C22C 33/00
(Continued)

(56) References Cited

U.S. PATENT DOCUMENTS

| | | |
|---|---|---|
| 6,177,166 B1 | 1/2001 | Ohno et al. |
| 6,858,277 B1 | 2/2005 | Yamada et al. |

(Continued)

FOREIGN PATENT DOCUMENTS

WO     2016123088 A1     8/2016

OTHER PUBLICATIONS

Barták et al. "Crystal growth kinetics and viscous behavior in Ge2Sb2Se5 undercooled melt." The Journal of Physical Chemistry B 120.32 (2016): 7998-8006.

(Continued)

*Primary Examiner* — Kaveh C Kianni
(74) *Attorney, Agent, or Firm* — Smith Baluch LLP

(57) ABSTRACT

An alloy of $Ge_xSb_ySe_zTe_m$ includes atoms of Ge, Sb, Se, and Te that form a crystalline structure having a plurality of vacancies randomly distributed in the crystalline structure. The alloy can be used to construct an optical device including a first waveguide to guide a light beam and a modulation layer disposed on the first waveguide. The modulation includes the alloy of $Ge_xSb_ySe_zTe_m$ which has a first refractive index $n_1$ in an amorphous state and a second refractive index $n_2$, greater than the first refractive index by at least 1, in a crystalline state. The first waveguide and the modulation layer are configured to guide about 1% to about 50% of the light beam in the modulation layer when the alloy is in the amorphous state and guide no optical mode when the alloy is in the crystalline state.

27 Claims, 24 Drawing Sheets

Related U.S. Application Data

(60) Provisional application No. 62/478,717, filed on Mar. 30, 2017.

(51) Int. Cl.
    *G02F 1/225*     (2006.01)
    *C23C 14/06*     (2006.01)
    *G02F 1/00*     (2006.01)
    *G02F 1/21*     (2006.01)

(52) U.S. Cl.
    CPC ............ *G02F 1/0018* (2013.01); *G02F 1/225* (2013.01); *G02F 1/212* (2021.01)

(58) Field of Classification Search
    USPC .......................................................... 385/1
    See application file for complete search history.

(56) References Cited

U.S. PATENT DOCUMENTS

| | | | | |
|---|---|---|---|---|
| 7,136,559 | B2* | 11/2006 | Yusoff | G02F 1/365 385/125 |
| 2004/0027646 | A1* | 2/2004 | Miller | G02B 6/12007 359/322 |
| 2007/0108430 | A1* | 5/2007 | Lung | H01L 45/1293 257/4 |
| 2007/0189053 | A1* | 8/2007 | Pellizzer | H01L 45/1233 365/96 |
| 2007/0210348 | A1* | 9/2007 | Song | H01L 45/1233 257/246 |
| 2008/0210924 | A1* | 9/2008 | Shin | H01L 45/1666 257/4 |
| 2009/0074652 | A1* | 3/2009 | Dussarrat | C23C 16/305 423/508 |
| 2010/0226163 | A1 | 9/2010 | Savransky | |
| 2011/0069540 | A1 | 3/2011 | Savransky | |
| 2011/0273756 | A1* | 11/2011 | Wang | B82Y 20/00 359/32 |
| 2012/0119181 | A1* | 5/2012 | Oh | H01L 27/224 257/4 |
| 2013/0037774 | A1* | 2/2013 | Song | H01L 27/249 257/2 |
| 2014/0203235 | A1 | 7/2014 | Lee et al. | |
| 2015/0029775 | A1 | 1/2015 | Ravasio et al. | |
| 2015/0378183 | A1 | 12/2015 | Pernice et al. | |
| 2018/0284492 | A1 | 10/2018 | Fang et al. | |
| 2019/0235228 | A1 | 8/2019 | Chou et al. | |

OTHER PUBLICATIONS

Buller et al., "Influence of Partial Substitution of Te by Se and Ge by Sn on the Properties of the Blu-ray Phase-Change Material Ge8Sb2Te11," Chem. Mater. 2012, 24, 3582-3590, dx.doi.org/10.1021/cm301809g (Aug. 20, 2012).

Chao et al., "Multi-level phase change memory using slow-quench operation: GST vs. GSST." VLSI Technology, Systems, and Applications, 2009. VLSI-TSA'09. International Symposium on. IEEE, 2009. 2 pages.

Cheng et al., "Wave manipulation with designer dielectric metasurfaces." Optics letters 39.21 (2014): 6285-6288.

Chou et al., Electrically Switchable Transparent Phase Change Materials. Monday, Jul. 23, 2018 International Nano-Optoelectronics Workshop (INOW). 24 pages.

Chou et al., Phase-Change Metamaterials for Reconfigurable Imagers. Apr. 4, 2018. 38 pages.

Chou et al., Reconfigurable Transparent Phase Change Materials for Infrared Photonics. 2018 SPIE Photonics West Conference. Jan. 31, 2018. 25 pages.

Gholipour et al., "An all-optical, non-volatile, bidirectional, phase-change meta-switch." Advanced materials 25.22 (2013): 3050-3054. 5 pages.

Hegyi et al., "Hyperspectral imaging with a liquid crystal polarization interferometer." Optics express 23.22 (2015): 28742-28754.

Hosseini et al., "An optoelectronic framework enabled by low-dimensional phase-change films." Nature 511.7508 (2014): 206-211.

International Search Report and Written Opinion in International Patent Application No. PCT/US19/15964 dated Jun. 3, 2019, 15 pages.

International Search Report and Written Opinion issued by the International Searching Authority for International Application No. PCT/US2018/25453, dated Aug. 8, 2018, 11 pages.

Koch et al., "Enhanced temperature stability and exceptionally high electrical contrast of selenium substituted Ge2Sb2Te5 phase change materials," RSC Adv., 2017, 7, 17164-17172 (Published on Mar. 20, 2017).

Koch et al., "Investigating the Influence of Resonant Bonding on the Optical Properties of Phase Change Materials (GeTe)xSnSb2Se4," Chem. Mater. 2017, 29, 9320-9327 (Oct. 4, 2017).

Lee et al., "Performances of GeSnSbTe material for high-speed phase change memory." VLSI Technology, Systems and Applications, 2007. VLSI-TSA 2007. International Symposium on. IEEE, 2007. 2 pages.

Lencer et al., "A map for phase-change materials." Nature Materials 7.12 (2008): 972-977.

Liberman et al., "Angle-and polarization-dependent collective excitation of plasmonic nanoarrays for surface enhanced infrared spectroscopy." Optics express 19.12 (2011): 11202-11212.

Matsunaga et al. "Structural analysis of GeSbTeSe phase-change materials." Libr E\PCOS 2009 (2009): 99-104.

Michels et al., "Optical probe for nondestructive wafer-scale characterization of photonic elements." IEEE Photonics Technology Letters 29.8 (2017): 643-646.

Moriyama et al., "Small-sized Mach-Zehnder interferometer optical switch using thin film Ge2Sb2Te5 phase-change material." Optical Fiber Communication Conference. Optical Society of America, 2014. 3 pages.

Ríos et al., "Integrated all-photonic non-volatile multi-level memory." Nature Photonics 9.11 (2015): 725-732.

Ríos et al., "On-Chip Photonic Memory Elements Employing Phase-Change Materials." Advanced Materials 26.9 (2014): 1372-1377.

Rosenthal et al, 'Enhancing the Thermoelectric Properties of Germanium Antimony Tellurides by Substitution with Selenium in Compounds Ge_n Sb_2 (Te 1?x Se_x)_n+3 (0 <=x<=0.5; n >=7)', Chemistry of Materials, vol. 26, Mar. 19, 2014 (Mar. 19, 2014), p. 2567-2578.

Rudé et al., "Active control of surface plasmon waveguides with a phase change material." ACS Photonics 2.6 (2015): 669-674.

Rudé et al., "Optical switching at 1.55 μ m in silicon racetrack resonators using phase change materials." Applied Physics Letters 103.14 (2013): 141119. 5 pages.

Shportko et al., "Resonant bonding in crystalline phase-change materials." Nature materials 7.8 (2008): 653-658.

Siegel et al., "Rewritable phase-change optical recording in Ge 2 Sb 2 Te 5 films induced by picosecond laser pulses." Applied physics letters 84.13 (2004): 2250-2252.

Soref, "Phase-change materials for Group-IV electro-optical switching and modulation." Group IV Photonics (GFP), 2015 IEEE 12th International Conference on. IEEE, 2015. 2 pages.

Stegmaier et al., "Thermo-optical effect in phase-change nanophotonics." ACS Photonics 3.5 (2016): 828-835.

Svoboda et al., "Amorphous-to-crystalline transition in Te-doped Ge2Sb2Se5 glass." Journal of Thermal Analysis and Calorimetry 117.3 (2014): 1073-1083.

Svoboda et al., "Thermal behavior of Se-rich GeSb2Se(4-y)Tey (glassy) system," Journal of Alloys and Compounds 670 (2016) 222-228 (Available online Feb. 9, 2016).

Taboada et al., "Thermo-optically tuned cascaded polymer waveguide taps." Applied physics letters 75.2 (1999): 163-165.

Topley et al., "Locally erasable couplers for optical device testing in silicon on insulator." Journal of Lightwave Technology 32.12 (2014): 2248-2253.

(56) References Cited

OTHER PUBLICATIONS

Topley et al., "Planar surface implanted diffractive grating couplers in SOI." Optics Express 22.1 (2014): 1077-1084.
Vinod et al, 'Structural transition and enhanced phase transition properties of Se doped Ge2Sb2Te5 alloys', Scientific Reports, vol. 5, article 8050, Jan. 30, 2015 (Jan. 30, 2015), p. 1-7.
Wang et al., "Optically reconfigurable metasurfaces and photonic devices based on phase change materials." Nature Photonics 10.1 (2016): 60-65.
Werner et al., "Adaptive phase change metamaterials for infrared aperture control." Unconventional Imaging, Wavefront Sensing, and Adaptive Coded Aperture Imaging and Non-Imaging Sensor Systems. vol. 8165. International Society for Optics and Photonics, 2011. 10 pages.
Wuttig et al., "Phase-change materials for non-volatile photonic applications." Nature Photonics 11.8 (2017): 465. 12 pages.
Wuttig et al., "Phase-change materials for rewriteable data storage." Nature materials 6.11 (2007): 824. 10 pages.
Zhang et al. "Extreme Broadband Transparent Optical Phase Change Materials for High-Performance Nonvolatile Photonics." arXiv preprint arXiv:1811.00526 (Nov. 1, 2018). 16 pages.
Zhang et al., "Broadband nonvolatile photonicswitching based on optical phase change materials: beyond the classical figure-of-merit," Optics Letters, vol. 43, No. 1, 4 pp. (Jan. 1, 2018). 4 pages.
Zhang et al., "Broadband transparent optical phase change materials." CLEO: Applications and Technology. Optical Society of America, 2017. 2 pages.

* cited by examiner

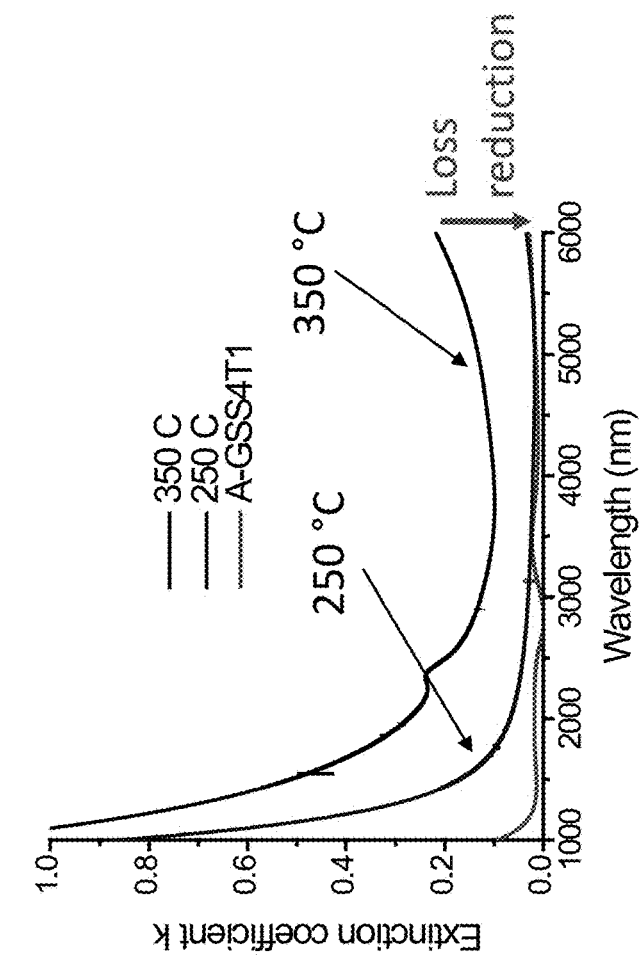
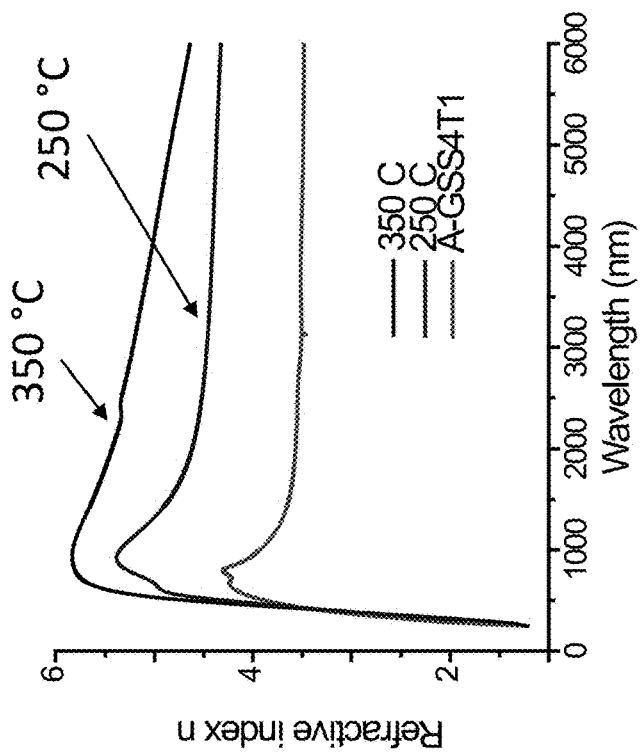
FIG. 5A
FIG. 5B

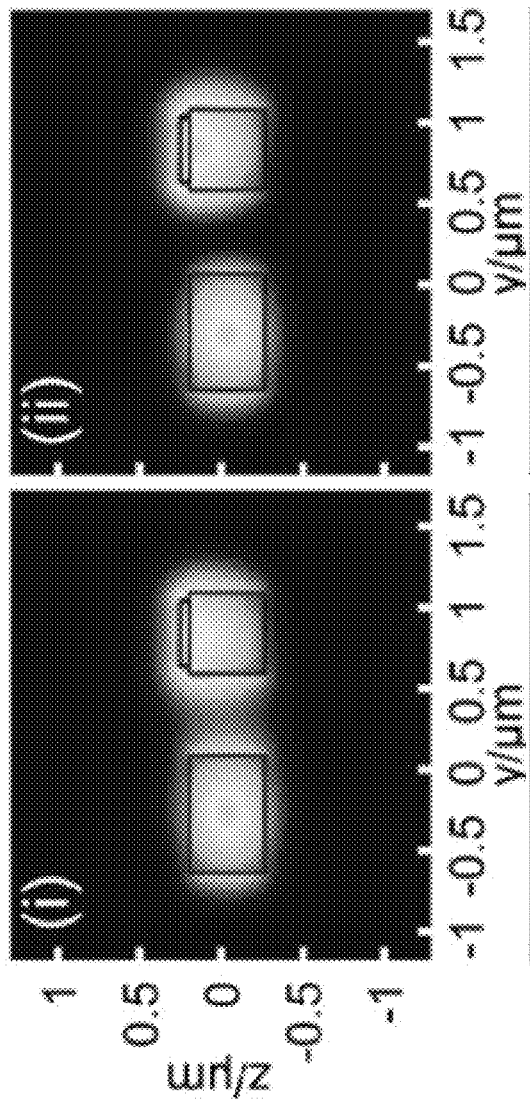
FIG. 7A
FIG. 7B
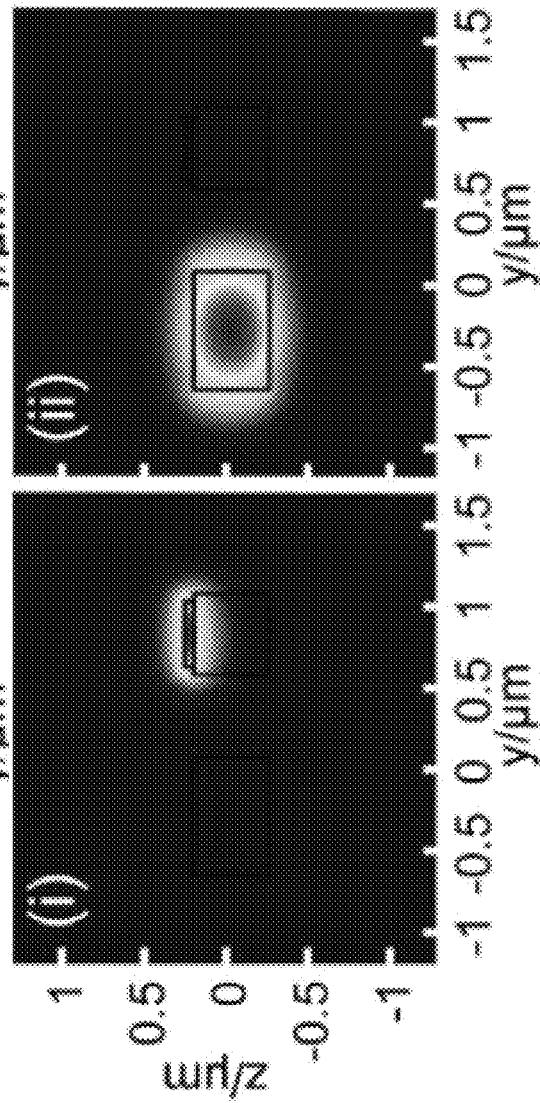
FIG. 7C
FIG. 7D

GSST AND APPLICATIONS IN OPTICAL DEVICES

CROSS-REFERENCES TO RELATED APPLICATIONS

This application is a divisional of U.S. application Ser. No. 15/941,879, now U.S. Pat. No. 10,634,938, filed Mar. 30, 2018, and entitled "GSST and Applications in Optical Devices," which in turn claims the priority benefit under 35 U.S.C. § 119(e) of U.S. Application No. 62/478,717, filed Mar. 30, 2017, and entitled "GE-SB-SE-TE MATERIALS AND OPTICAL DEVICES INCORPORATING SAME." Each of these applications is hereby incorporated herein by reference in its entirety for all purposes.

GOVERNMENT SUPPORT

This invention was made with Government support under Grant No. FA8702-15-D-0001 awarded by the U.S. Air Force. The Government has certain rights in the invention.

BACKGROUND

Phase change materials (PCMs), such as GeSbTe (GST), are able to be switched between amorphous and crystalline states upon the application of an electrical pulse or a laser pulse. Their material properties, such as conductivity, bandgap, and refractive index, are distinct in the two states. Due to this property, PCMs have been widely used to construct electronic nonvolatile memories.

PCMs may also be used for constructing optical devices, which have a wide range of applications, such as sensing, imaging, and cognitive optical networks. For example, optical switching, i.e., dynamic routing of light into different paths, is widely used in photonic integrated circuits. Current on-chip optical switches are mostly based on electro-optical or thermo-optical effects, which usually produce small refractive index perturbations (e.g., typically well below 0.01). Therefore, the resulting devices often have a large footprint and significant energy consumption. In addition, switching mechanisms based on electro-optic or thermo-optical effects are volatile, so a continuous power supply is often used to maintain the optical switching state, thereby further increasing the energy consumption.

In recent years, optical devices based on PCMs have emerged for on-chip switching and routing. PCMs can generate a large difference in the refractive index during phase transition. In addition, a phase transition in a PCM can be nonvolatile, thereby allowing self-holding or latching in the resulting optical switches in the absence of power.

Despite these attractive features, the performance of existing PCM-based photonic switches is typically compromised by the high optical absorption in traditional PCMs. The two most commonly used PCMs include $VO_2$ and $Ge_2Sb_2Te_5$ (i.e., GST 225), both of which suffer from excessive optical losses even in their dielectric states. For example, the extinction coefficient (i.e., imaginary part of the refractive index) of amorphous GST is about 0.12 at 1550 nm wavelength, corresponding to about 42,000 dB/cm attenuation, which is unacceptably high for many guided-wave device applications.

SUMMARY

Embodiments of the present technology generally relate to GSST materials and their applications in optical devices.

In one example, an alloy of $Ge_xSb_ySe_zTe_m$ is disclosed and atoms of Ge, Sb, Se, and Te in the alloy form a crystalline structure having a plurality of vacancies randomly distributed in the crystalline structure.

In another example, a method of modulating a light beam propagating in a waveguide includes heating a modulation layer, in optical communication with the waveguide, to a first temperature. The modulation layer includes an alloy of $Ge_xSb_ySe_zTe_m$ switchable between an amorphous state and a crystalline state. The first temperature is greater than a phase transition temperature of the alloy and less than about 100 degrees Celsius above the phase transition temperature. The heating causes the alloy to form a crystalline structure having a plurality of vacancies randomly distributed in the crystalline structure.

In yet another example, an apparatus includes a first waveguide to guide a light beam and a modulation layer disposed on the first waveguide. The modulation includes an alloy of $Ge_xSb_ySe_zTe_m$ having a first refractive index $n_1$ in an amorphous state and a second refractive index $n_2$, greater than the first refractive index by at least 1, in a crystalline state. The first waveguide and the modulation layer are configured to guide about 1% to about 50% of the light beam in the modulation layer when the alloy is in the amorphous state.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 5A and 5B show measured refractive indices and extinction coefficients, respectively, of a $Ge_2Sb_2Se_4Te_1$ alloy after annealing at different temperatures.

FIGS. 7A-7B show simulated intensity profiles of even supermodes and odd supermodes in a two-waveguide system when the GSST is in the amorphous state.

FIGS. 7C-7D show simulated intensity profiles of even supermodes and odd supermodes, respectively, in the two-waveguide system shown in FIGS. 7A-7B when the GSST is in the crystalline state.

DETAILED DESCRIPTION

GSST Alloy

To address the challenges in conventional optical devices using phase change materials (PCMs), a new alloy of $Ge_xSb_ySe_zTe_m$ is engineered to have low optical loss in the optical and near infrared regime and a large difference in the refractive index (e.g., greater than 1) for different phases or states. The alloy of $Ge_xSb_ySe_zTe_m$ includes four elements, germanium (Ge), antimony (Sb), selenium (Se), and tellurium (Te), and vacancies distributed among these atoms. The low optical loss can be attributed to the atomic structure of the alloy in its crystalline state, in which atoms of Ge, Sb, Se, and Te form a crystalline structure (i.e., ordered structure) while multiple vacancies are randomly distributed in the crystalline structure. To realize this atomic structure, an annealing step can be performed on the alloy in the amorphous state. The annealing temperature is within the window between the phase transition temperature of the alloy and about 100° C. above the phase transition temperature. Within this window, the annealing can cause the atoms of Ge, Sb, Se, and Te to form a crystalline structure without creating ordered distribution of vacancies. Without being bound by any particular theory or mode of operation, a disordered distribution of vacancies can introduce the Anderson-localization effect, which can localize the carriers and decrease the carrier mobility, thereby providing low free carrier loss.

Figure 1A:
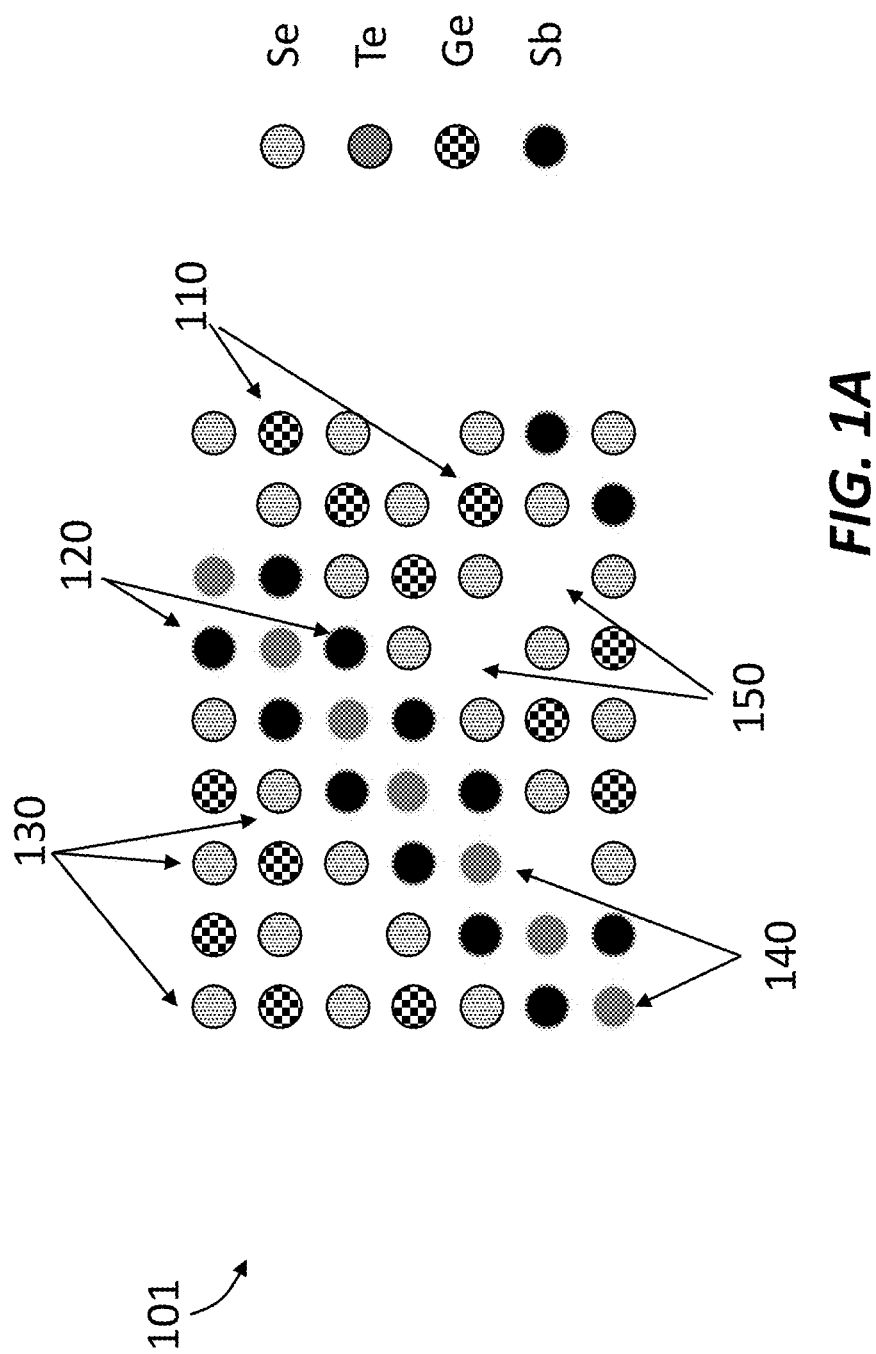
FIGS. 1A-1C illustrate the atomic structure of an alloy of $Ge_xSb_ySe_zTe_m$ in different states.
Figure 1C:
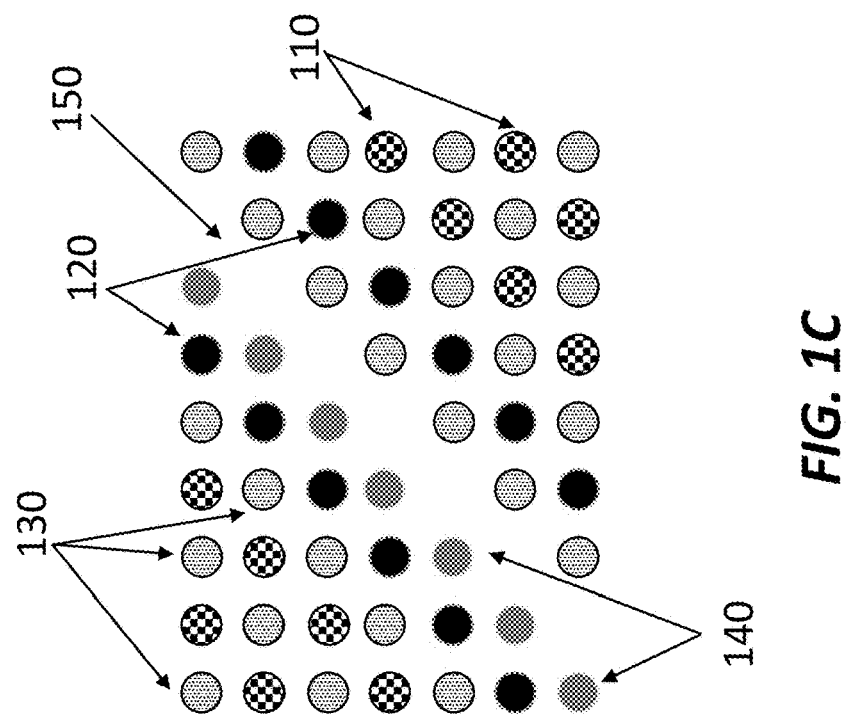
Figure 1B:
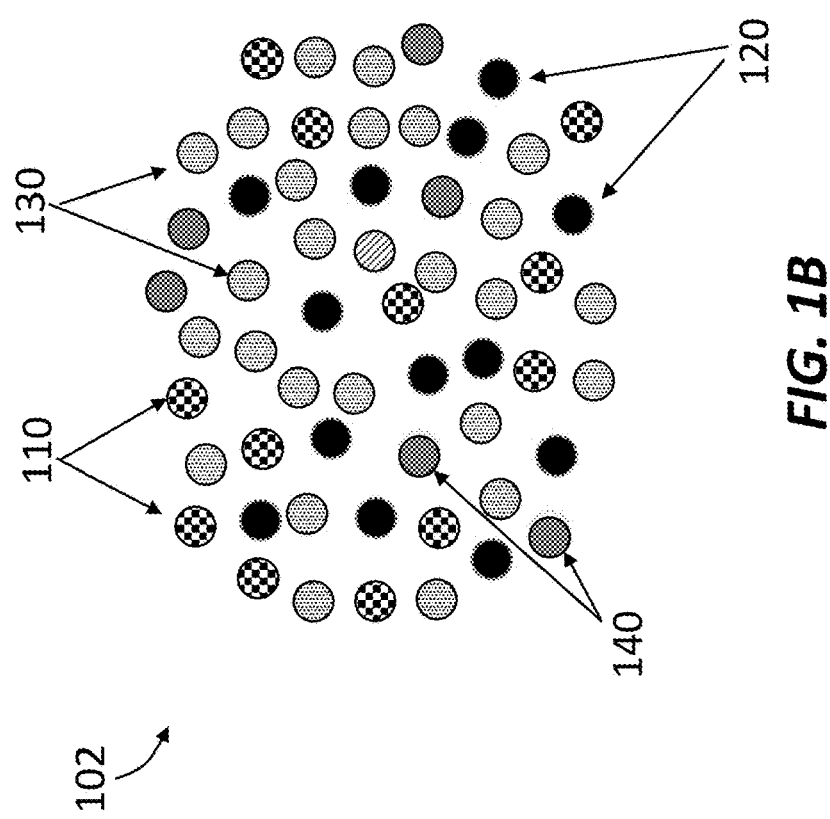

FIGS. 1A-1C show atomic structures of the alloy $Ge_xSb_ySe_zTe_m$ in different states (also referred to as different phases). FIG. 1A shows an atomic structure 101 when the alloy $Ge_xSb_ySe_zTe_m$ is in a crystalline state after proper annealing (more details of the annealing process are provided below). In this atomic structure 101, the atoms of Ge (110), Sb (120), Se (130), and Te (140) form a crystalline structure, i.e., these atoms 110 to 140 are arranged in an ordered configuration. The atomic structure 101 also includes multiple vacancies 150 randomly distributed within the crystalline structure formed by the atoms 110 to 140. The atomic density of the vacancies 150 in the alloy can be, for example, from about 0.5 at. % to about 20 at. % (e.g., about 0.5 at. %, about 1 at. %, about 2 at. %, about 3 at. %, about 4 at. %, about 5 at. %, about 6 at. %, about 7 at. %, about 8 at. %, about 9 at. %, about 10 at. %, about 12 at. %, about 14 at. %, about 16 at. %, about 18 at. %, or about 20 at. %, including any values and sub ranges in between).

FIG. 1B shows an atomic structure 102 for the $Ge_xSb_ySe_zTe_m$ alloy in the amorphous state. In this atomic structure 102, the atoms 110 to 140 are randomly distributed. The atomic structures 101 and 102 shown in FIGS. 1A and 1B, respectively, can be used to construct optical devices. The transition from the amorphous state to the crystalline state can be realized by increasing the temperature of the $Ge_xSb_ySe_zTe_m$ alloy (e.g., between phase transition temperature and 100° C. above the phase transition temperature). The reverse transition (i.e., from the crystalline state to the amorphous state) can be realized by further increasing the temperature of the alloy, followed by a fast cooling process. More details below about the application of the alloy $Ge_xSb_ySe_zTe_m$ in optical devices are provided below with reference to FIGS. 6-13.

For comparison, FIG. 1C shows an atomic structure 103 of the $Ge_xSb_ySe_zTe_m$ alloy formed by over annealing (e.g., annealing at a temperature higher than a threshold temperature). In the atomic structure 103, the atoms 110-140 form a crystalline structure and the vacancies 150 are also aligned along a straight line to form an ordered arrangement. Compared to the atomic structure 101 shown in FIG. 1A, the atomic structure 103 in FIG. 1C usually has a higher optical loss.

The alloy $Ge_xSb_ySe_zTe_m$ described herein can include various compositions (e.g., different atomic percentages of each element). Selenium has a smaller atomic number than tellurium and is a good glass former. In generally, substituting Te with Se (e.g., in conventional GST) can increase the bandgap as well as decrease the optical loss of the resulting alloy.

In one example, x+y is about 0.4 to about 0.5 (e.g., about 0.4, about 0.42, about 0.44, about 0.46, about 0.48, or about 0.5, including any values and sub ranges in between), z is from about 0.1 to about 0.54 (e.g., about 0.1, about 0.2 about 0.3, about 0.4, about 0.5, about 0.52, or about 0.54, including any values and sub ranges in between), and x+y+z+m=1.

In another example, x can be less than 0.15 (e.g., about 0.15, about 0.14, about 0.13, about 0.12, about 0.11, about 0.1, about 0.08, about 0.06, about 0.04, or lower, including any values and sub ranges in between), y is about 0.5 to about 0.68 (e.g., about 0.5, about 0.52, about 0.54, about 0.56, about 0.58, about 0.6, about 0.62, about 0.64, about 0.66, or about 0.68, including any values and sub ranges in between), z is from about 0.05 to about 0.3 (e.g., about 0.05, about 0.1, about 0.15, about 0.2, about 0.25, or about 0.3, including any values and sub ranges in between), and x+y+z+m=1.

The compositions of the $Ge_xSb_ySe_zTe_m$ alloy can also be expressed in terms of atomic percentages. In general, a higher atomic percentage of Se can decrease the optical loss of the resulting alloy but may also slow down the crystallization process during phase transition. In practice, at least the following compositions can be used. In one example, the $Ge_xSb_ySe_zTe_m$ alloy can include about 0 to 50 at. % of Ge, about 0 to about 50 at. % of Sb, about 5 at. % to about at. 50% of Te, about 10 at. % to about 55% of Se, and the sum of atomic percentages of all elements in the alloy is 100 at. %.

In another example, the $Ge_xSb_ySe_zTe_m$ alloy can include about 0 at. % to about 15 at. % of Ge, about 50 at. % to about 70 at. % of Sb, about 2 at. % to about 30 at. % of Te, about 5 at. % to about 30 at. % of Se, and the sum of atomic percentages of all elements in the alloy is 100 at. %.

In yet another example, the $Ge_xSb_ySe_zTe_m$ alloy can include about 0 at. % to about 45 at. % of Ge, about 0 at. % to about 50 at. % of Sb, about 5 at. % to about 45 at. % of Te, about 10 at. % to about 55 at. % of Se, and the sum of atomic percentages of all elements in the alloy is 100 at. %.

In yet another example, the $Ge_xSb_ySe_zTe_m$ alloy can include about 0 at. % to about 10 at. % of Ge, about 50 at. % to about 70 at. % of Sb, about 2 at. % to about 30 at. % of Te, and about 5 at. % to about 30 at. % of Se, and the sum of atomic percentages of all elements in the alloy is 100 at. %.

The $Ge_xSb_ySe_zTe_m$ alloy described herein can be characterized by various properties. For example, the phase change temperature $T_c$ (also referred to as the transition temperature) of the alloy can be about 150° C. to about 400° C. (e.g., about 150° C., about 200° C., about 250° C., about 300° C., about 350° C., or about 400° C., including any values and sub ranges in between). The phase change temperature $T_c$ can also determine the annealing temperature that is used to transition the alloy from the amorphous state to the crystalline state. For example, the annealing temperature can be about $T_c$ to about $T_c+100°$ C. (e.g., about $T_c$, about $T_c+20°$ C., about $T_c+40°$ C., about $T_c+60°$ C., about $T_c+80°$ C., or about $T_c+100°$ C., including any values and sub ranges in between).

The resistivity of the $Ge_xSb_ySe_zTe_m$ alloy (in amorphous state and crystalline state) can be substantially equal to or greater than about 1 Ω·cm (e.g., about 1 Ω·cm, about 2 Ω·cm, about 3 Ω·cm, about 5 Ω·cm, about 10 Ω·cm, or greater, including any values and sub ranges in between). Correspondingly, the conductivity of the $Ge_xSb_ySe_zTe_m$ alloy can be substantially equal to or less than about 1 S/cm (e.g., about 1 S/cm, about 0.5 S/cm, about 0.3 S/cm, about 0.2 S/cm, about 0.1 S/cm, or less, including any values and sub ranges in between). Higher resistivity corresponds to lower conductivity and can lead to lower free carrier absorption. Therefore, optical losses of the alloy is also lower.

The complex refractive index N of the $Ge_xSb_ySe_zTe_m$ alloy can be generally written as N=n+ik, where n is the real part of the refractive index and k is the imaginary part of the refractive index (also referred to as the extinction coefficient throughout this Application). The alloy has distinct refractive indices $N_1$ and $N_2$ in the amorphous state and the crystalline state, respectively. More specifically, $N_1=n_1+ik_1$, and $N_2=n_2+ik_2$.

In optical devices, such as optical switches and modulators, it can be helpful to have a large difference between $n_1$ and $n_2$, also referred to as the refractive index difference Δn, so as to achieve more efficient modulation of light beams. The alloy $Ge_xSb_ySe_zTe_m$ described herein can provide a refractive index difference Δn greater than 1 (e.g., about 1, about 1.1, about 1.2, about 1.3, about 1.4, about 1.5, about 1.6, about 1.7, about 1.8, or greater, including any values and sub ranges in between) when it switches between phases.

The extinction coefficient k in the complex refractive index N usually determines the optical losses of $Ge_xSb_ySe_zTe_m$. $Ge_xSb_ySe_zTe_m$, in the crystalline state, can have an extinction coefficient IQ substantially equal to or less than $10^{-3}$ (e.g., about $10^{-3}$, about $5 \times 10^{-4}$, about $10^{-4}$, about $5 \times 10^{-5}$, or less, including any values and sub ranges in between). The extinction coefficient $k_1$ of the alloy in the amorphous state is usually even smaller than $k_2$. For example, the, $k_1$ can be negligible in the mid-IR wavelengths and around $10^{-4}$ or less in telecomm wavelength (e.g. about 1260 nm to about 162 nm).

The impact of loss on the performance of optical devices is usually quantified using the material figure-of-merit FOM=Δn/k, where k is the extinction coefficient of the PCM in the crystalline state. This FOM is quantitatively correlated with the insertion loss (IL) and contrast ratio in all-optical, electro-optical, and magneto-optical devices. Conventional PCMs, such as $VO_2$ and GST, usually have low FOMs of about 0.7 and 2.1, respectively, at 1550 nm. As a result, switches based on these materials have high ILs (e.g., about 2 dB or more) and limited crosstalk (e.g., less than about 15 dB in the C-band). As used herein, the crosstalk refers to the contrast ratio between the on/off states at the output ports (e.g., of an optical switch). In contrast, the alloy $Ge_xSb_ySe_zTe_m$ described herein can provide a high FOM due to the large refractive index change and the small extinction coefficient. For example, the FOM of the alloy $Ge_xSb_ySe_zTe_m$ can be substantially equal to or greater than 4 (e.g., about 4, about 5, about 10, about 20, about 30, about 50, about 100, about 200, about 300, about 500, about 1000, or greater, including any values and sub ranges in between).

Experimental Characterizations of GSST Alloy

Figure 2:
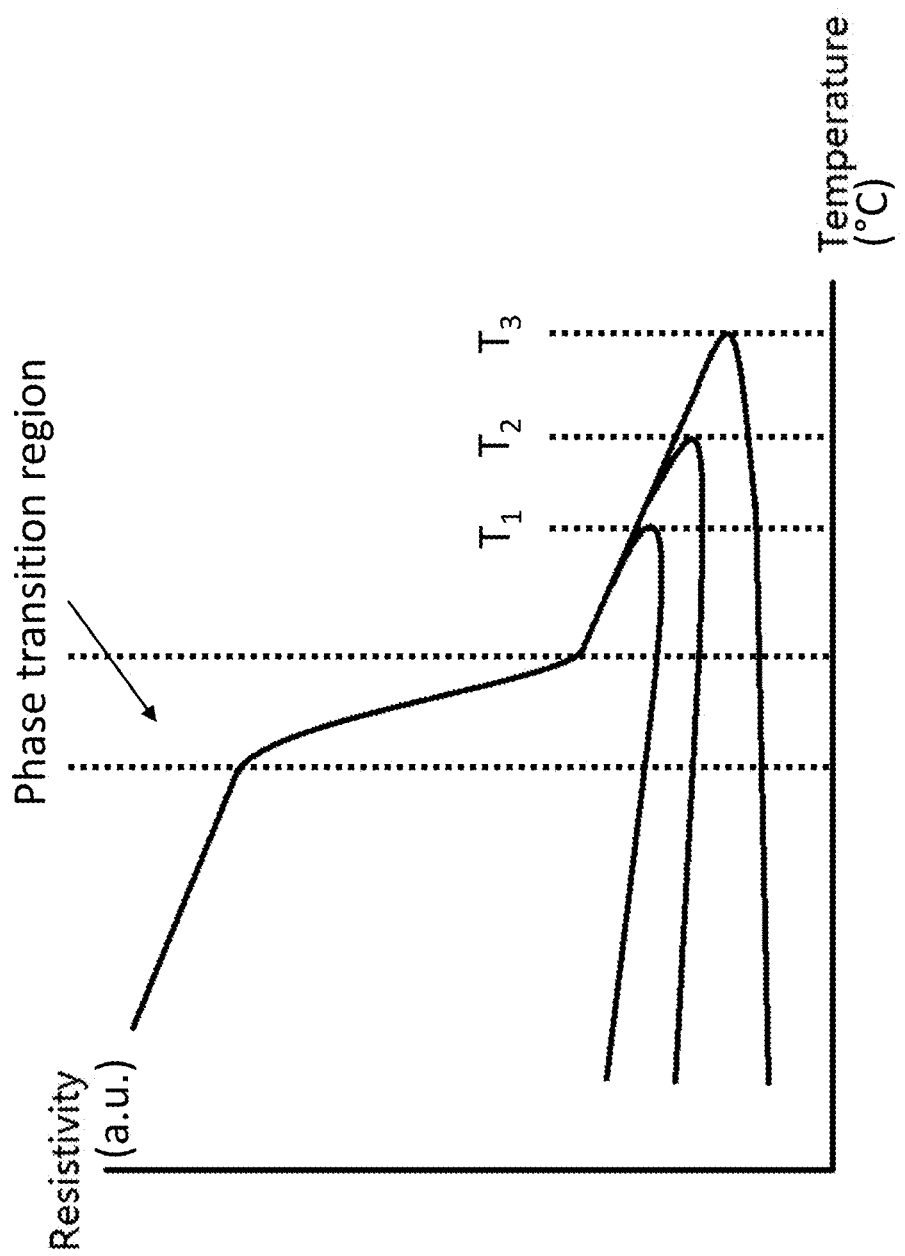
FIG. 2 is measured resistivity of a $Ge_2Sb_2Se_4Te_1$ alloy as a function of temperature.

FIG. 2 shows measured resistivity of a $Ge_2Sb_2Se_4Te_1$ alloy as a function of temperature. As the temperature increases, the alloy enters the phase transition region where the resistivity of the alloy decrease sharply. After phase transition, the resistivity continues to decrease due to the ordering of vacancies. When the alloy is annealed to T1 or T2, the alloy can still maintain insulating charge transport behavior. When the annealing temperature increases even further, for example, to T3, the alloy starts to become metallic. In optical applications, infrared absorption is mainly induced by free carrier loss. Therefore, the optical loss increases as the alloy becomes metallic.

Figures 3A, 3B:
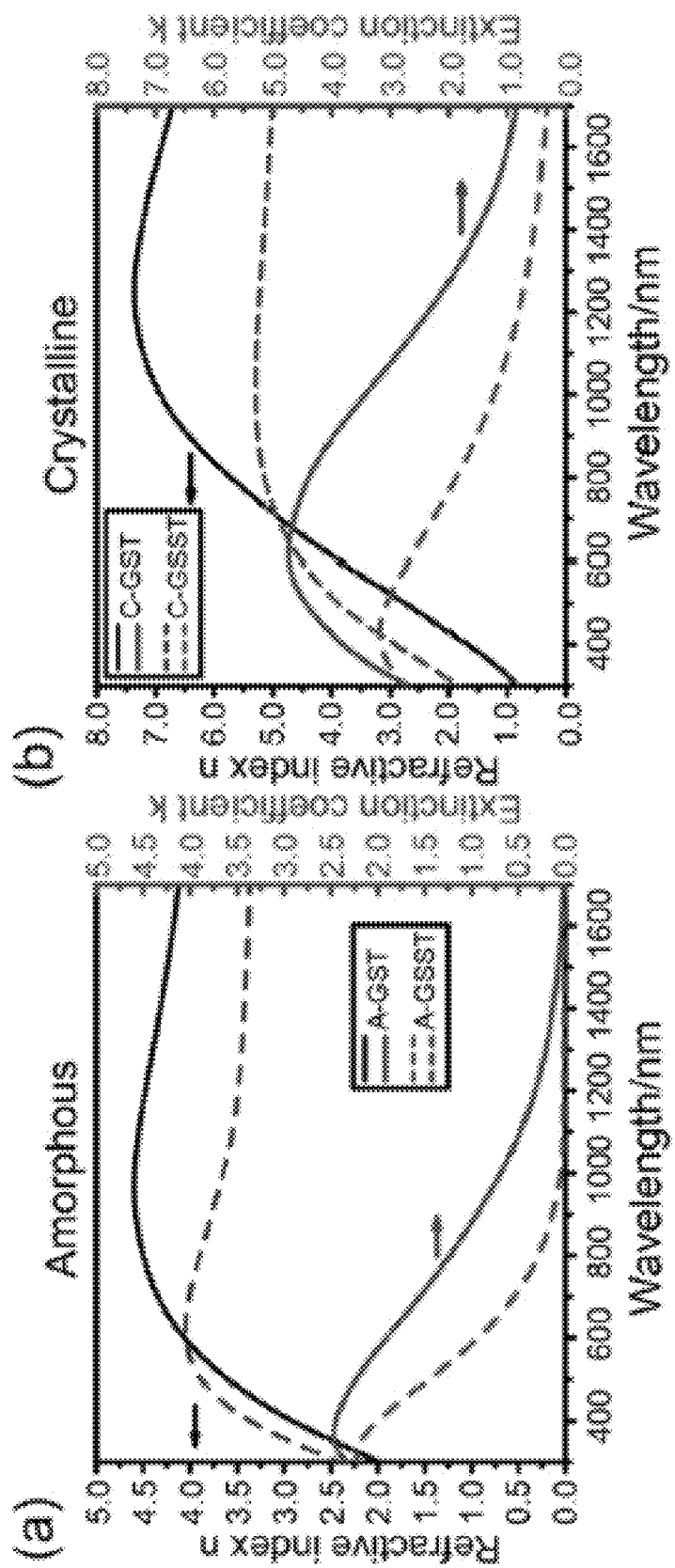
FIGS. 3A and 3B are measured refractive indices and extinction coefficients of $Ge_2Sb_2Te_5$ and $Ge_2Sb_2Se_4Te_1$ in the amorphous state and crystalline state, respectively.

FIGS. 3A and 3B are measured refractive indices and extinction coefficients of $Ge_2Sb_2Te_5$ and $Ge_2Sb_2Se_4Te_1$ in the amorphous state and crystalline state, respectively. The measurements were performed using ellipsometry on thermally evaporated films of the alloys. The refractive index difference of the GSST sample is greater than 1 within a large spectral window (e.g., above 800 nm). It can also be seen from FIGS. 3A and 3B that GSST exhibits lower optical loss in both amorphous and crystalline states compared to GST. The FOM of GSST is about 4.2 at 1550 nm, about twice that of the GST sample. In addition, optical attenuation in amorphous GSST, as indicated by the extinction coefficient shown in FIG. 3A, is vanishingly small in the telecom window and well below the sensitivity limit of the ellipsometry. A waveguide cut-back method was therefore employed to quantify the loss in the amorphous GSST and the measured extinction coefficient k is about $1.8 \pm 1.2 \times 10^{-4}$, which is over 600 times smaller than that of GST.

Figure 4:
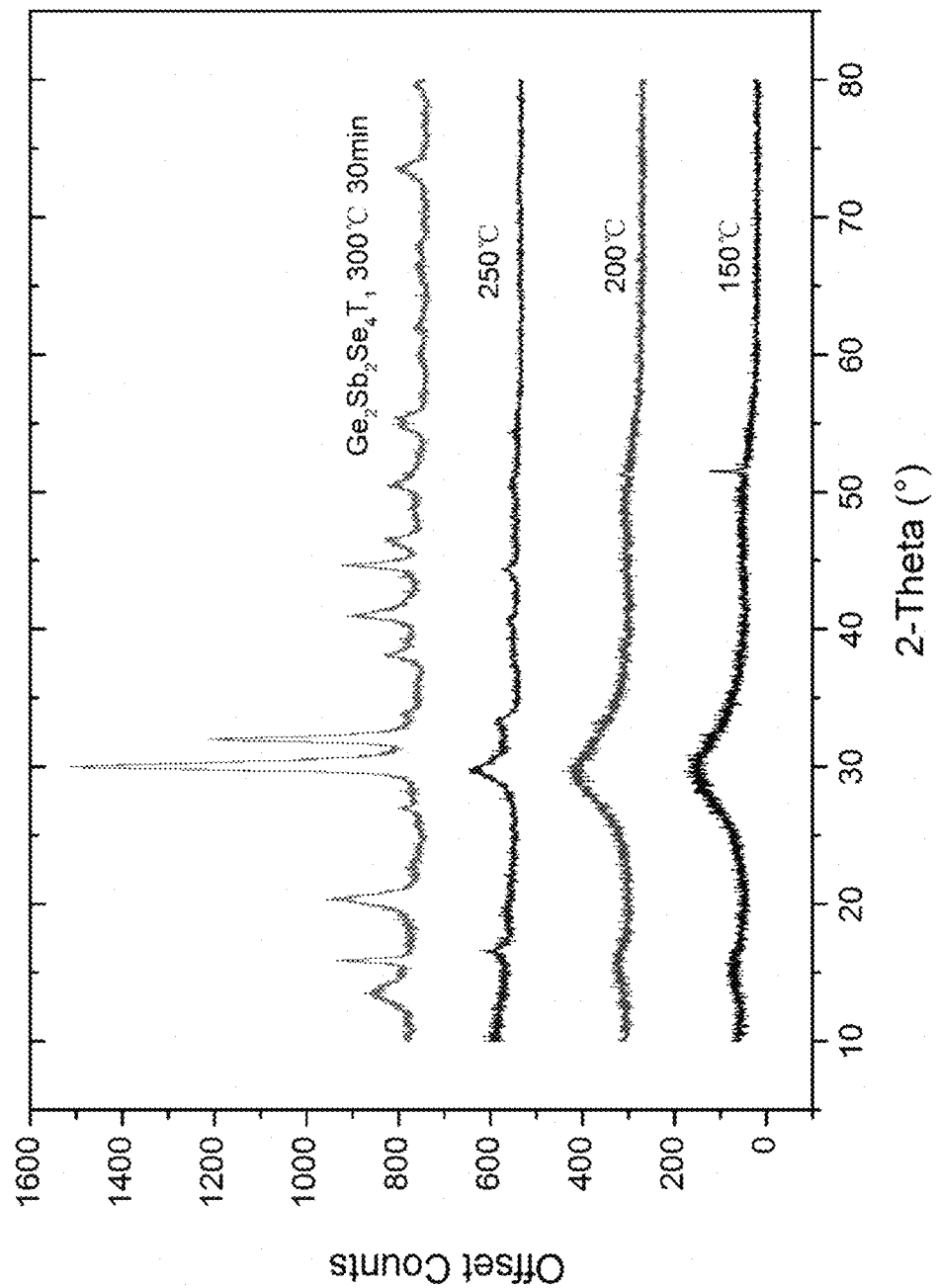
FIG. 4 shows x-ray diffraction (XRD) measurements of a $Ge_2Sb_2Se_4Te_1$ alloy after annealing at different temperatures.

FIG. 4 shows x-ray diffraction (XRD) measurements of a $Ge_2Sb_2Se_4Te_1$ alloy after annealing at different temperatures, from about 150° C. to about 300° C., for about 30 minutes. The alloy is derived by replacing 80% of the Te in $Ge_2Sb_2Te_5$ with Se. The sharp peaks in the top curve (i.e., annealed at 300° C.) indicate that the alloy is in the crystalline state.

FIGS. 5A and 5B show measured refractive indices and extinction coefficients, respectively, of a $Ge_2Sb_2Se_4Te_1$ alloy after annealing at different temperatures (in the crystalline state). The refractive index and the extinction coefficient of the alloy in the amorphous state is also shown. FIG. 5A shows that the refractive index change after phase transition is at a level greater than 1 over a wide spectral range (e.g., greater than 1000 nm or 1 µm). The extinction coefficient measurements in FIG. 5B demonstrate that reducing the annealing temperature from about 350° C. to about 250° C. (close to the phase transition temperature) can significantly lower the optical losses. In addition, the conductivity of the alloy after annealing at 350° C. and 250° C. is about 18 S/cm and 0.39 S/cm, respectively. The FOMs of the alloy after annealing at 350° C. and 250° C. are about 46 and 9.1, respectively. These FOMs are already significantly higher than those achieved in conventional PCMs, such as GST.

Optical Devices Including GSST

The phase change materials described herein can be used in various types of optical devices, such as optical switches and modulators, due to their low losses in the optical regime. As shown in the characterizations above (e.g., FIGS. 3A and 3B), the FOM of GSST is predominantly limited by the moderate loss in its crystalline state. For example, at 1550 nm, c-GSST's extinction coefficient is about 0.42, which is much lower than that of c-GST but is still high for guided-wave devices.

Close inspection of the FOM reveals that its derivation builds on an underlying assumption: the material property modulation during the switching operation (i.e., phase transition) is sufficiently small such that perturbations to the optical mode comprise a high-order effect and are usually neglected. Under this condition, the modal overlap with the PCM can be characterized by a single parameter, i.e., the confinement factor Γ. Both the desired phase shift (induced by Δn) and the unwanted optical loss (imposed by k) scale with Γ. The small perturbation assumption applies to devices relying on traditional electro-optic, thermo-optic, all-optical, and magneto-optical mechanisms. Therefore, the performance of these devices is usually bound by the FOM, regardless of the specific device configuration (e.g., Mach-Zehnder interferometers (MZIs), directional couplers (DCs), or micro-ring resonators).

The large optical property contrast between the two states in the alloy of GSST, however, permits different modal confinement factors in the two states. For example, the device can be engineered to have large modal confinement within the GSST layer when the GSST is in the low-loss amorphous state, and minimal optical field overlap with GSST when the GSST is switched to the crystalline state. This configuration is referred to as a "non-perturbative" design and can achieve low-loss, high-contrast modulation (e.g., switching) beyond the classical performance limits set forth by the material FOM.

Figure 6:
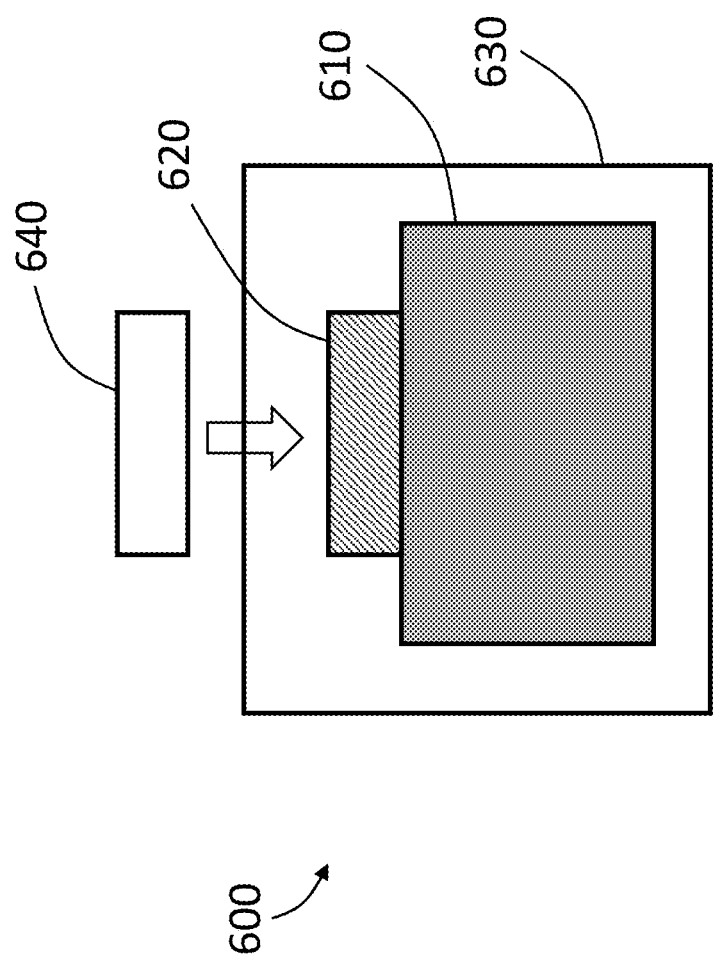
FIG. 6 shows a schematic of an optical device including an alloy of $Ge_xSb_ySe_zTe_m$ for light beam modulation.

FIG. 6 shows a schematic of an optical device 600 including an alloy of $Ge_xSb_ySe_zTe_m$ for light beam modulation. The device 600 includes a waveguide 610 to guide a light beam and a modulation layer 620 disposed on the waveguide 610 to modulate the light propagating in the waveguide 610. The device 600 can also include an optional cladding 630 surrounding the waveguide 610. The cladding 630 can have a refractive index smaller than the refractive index of the waveguide 610. For example, the waveguide 610 can include silicon nitride (SiN) and the cladding 630 can include silicon oxide. In another example, the cladding 630 can be ambient air.

The modulation layer 620 includes the GSST alloy described herein. A controller 640 can be used to switch the GSST alloy between the amorphous state and the crystalline state. In one example, the controller 640 includes a heat source to increase the temperature of the modulation layer to the annealing temperature (e.g., above the phase transition temperature but less than 100° C. above the phase transition temperature) so as to switch the GSST alloy into the crystalline state. In another example, the controller 640 can include a laser to heat the modulation layer 620 using optical pulses or beams. In the crystalline state, the modulation layer 620 may have some optical losses and the waveguide 610 can be configured to guide almost all the light beam (i.e., negligible propagation in the modulation layer 620).

The controller 640 is also able to further increase the temperature of the GSST alloy to be higher than the melting temperature of the alloy (e.g., about 600° C. or higher), followed by a fast cooling process, to switch the GSST alloy back to the amorphous state. The cooling rate can be, for example, about $10^{5}$° C. per second or greater (e.g., about $10^{5}$° C. per second, about $5 \times 10^{5}$° C. per second, about $10^{6}$° C. per second, or greater, including any values and sub ranges in between). This high cooling rate can be achieved by, for example, reducing the thickness of the modulation layer 620. For example, the thickness of the modulation layer 620 can be about 1 mm or less (e.g., about 1 mm, about 500 µm, about 200 µm, about 100 µm, about 50 µm, about 20 µm, about 10 µm, about 5 µm, about 2 µm, about 1 µm, about 500 nm, about 200 nm, about 100 nm, or less, including any values and sub ranges in between).

Since GSST in the amorphous state has very low optical loss, part of the light beam can be guided in the modulation layer. For example, the modulation layer 620 can be configured to guide about 1% to about 50% of the optical power in the light beam (e.g., about 1%, about 2%, about 5%, about 10%, about 20%, about 30%, about 40%, or about 50%, including any values and sub ranges in between). To facilitate the change of mode propagation induced by the phase transition of the GSST alloy, the refractive index of the waveguide 610 can be substantially identical to the refractive index of the modulation layer 620 in the amorphous state. When the GSST alloy transitions to the crystalline state, its refractive index can change by more than 1 and thus become very different from the refractive index of the waveguide 610. Accordingly, optical modes can be pushed out of the modulation layer 620 and confined within the waveguide 610.

In operation, a method of modulating a light beam propagating in the waveguide 610 includes heating the modulation layer 620 to a first temperature, which is greater than the phase transition temperature of the alloy and less than about 100 degrees Celsius above the phase transition temperature (i.e., between $T_c$ and $T_c+100°$ C., where $T_c$ is the phase transition temperature). For example, the first temperature used in the annealing process can be about 200° C. to about 350° C. (e.g., about 200° C., about 250° C., about 300° C., or about 350° C., including any values and sub ranges in between). The heating process is also referred to as an annealing process and causes the alloy to form a crystalline structure having a plurality of vacancies randomly distributed in the crystalline structure. In one example, a heater can be used to increase the temperature of the modulation layer 620. In another example, a laser pulse can be used to increase the temperature of the modulation layer 620.

The device 600 shown in FIG. 6 can be extended to a general structure including a first optical element and a second optical element disposed in optical communication with the first optical element. The second optical element is made of the GSST alloy described herein. The first optical element is configured to provide optical confinement of a light beam and the second optical element is configured to modulate electromagnetic field distribution within the first optical element. In one example, the second optical element can be disposed on the first optical element. In another example, the second optical element can be disposed within the first optical element. In yet another example, the second optical element can be separated from the first optical element by a third element.

The device 600 shown in FIG. 6 is a building block that can be used to construct various other optical devices. FIGS. 7A-7B show simulated intensity profiles of even supermodes and odd supermodes in a two-waveguide system when the GSST is in the amorphous state. FIGS. 7C-7D show simulated intensity profiles of even supermodes and odd supermodes, respectively, in the two-waveguide system when the GSST is in the crystalline state. The two-waveguide system includes two waveguides disposed in parallel with each other. A modulation layer made of GSST is disposed on the right waveguide and not on the left waveguide. In these simulations, the two waveguides are made of SiN and have the same core height. In addition, the widths of the two waveguides are adjusted such that their effective indices are identical when the GSST is amorphous. As a result, the phase matching can lead to strong coupling between the two waveguides with well-defined even (symmetric) and odd (antisymmetric) supermodes (see FIGS. 7A and 7B). In contrast, the large effective index disparity between the two waveguides when the GSST is in the crystalline state results in two isolated modes (see FIGS. 7C and 7D).

In operation, the system can be configured to allow only the odd modes (shown in FIGS. 7B and 7D) to be excited, thereby allowing guiding of light in the modulation layer with amorphous GSST (FIG. 7B) and prohibiting guiding of light in the modulation layer with crystalline GSST (FIG. 7D). For example, light can be delivered into bare waveguide (i.e. left waveguide without the GSST layer). When the GSST is amorphous, the strong coupling in FIGS. 7A and 7B can route the light from the left waveguide to the right waveguide capped with the GSST. When GSST is crystalline, the indices in FIGS. 7C and 7D are so different that the strong coupling disappears. Therefore the light remains in the left waveguide. Since negligible amount of light is coupled to the GSST capped waveguide, the crystalline GSST does not induce loss in the optical propagation.

Figures 8A, 8B:
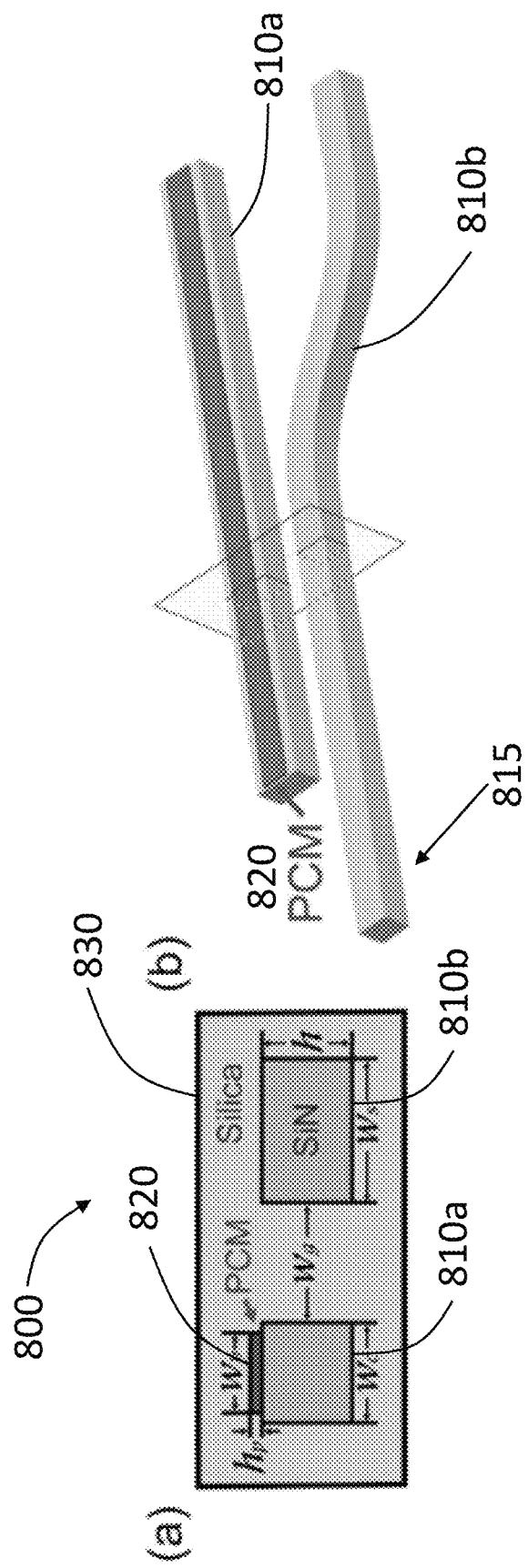
FIGS. 8A and 8B show a cross sectional view and a perspective view of an optical switch using GSST alloy for light routing.

FIGS. 8A and 8B show a cross sectional view and a perspective view, respectively, of an optical switch 800 using GSST alloy for light routing. The optical switch 800 includes a first waveguide 810a and a second waveguide 810b. At least a portion of the second waveguide 810b is parallel to the first waveguide 810a. A modulation layer 820 made of the GSST alloy described herein is disposed on the first waveguide 810a. The optical switch 800 can also include an optional cladding 830 (e.g., silicon oxide) surrounding the two waveguides 810a and 810b.

As illustrated in FIG. 8A, the width $w_c$ of the first waveguide 810a is substantially identical to the spacing $w_g$ between the two waveguides 810a and 810b, i.e., $w_c=w_g$ (e.g., about 500 nm). The width $w_s$ (e.g., about 720 nm) of the second waveguide 810b is slightly greater than the width $w_c$ of the first waveguide 810a to ensure that the effective index of the second waveguide 810b is the same as the effective index of the combination of the first waveguide 810a and the modulation layer 820 (in amorphous state). The width $w_p$ (e.g., about 400 nm) of the modulation layer 820 can be less than the width $w_c$ of the first waveguide 810a. The heights h of the two waveguides 810a and 810b are identical (e.g., about 450 nm) and the height $h_p$ of the modulation layer 820 can be less than the height h (e.g., about 60 nm).

Figures 8C, 8D:
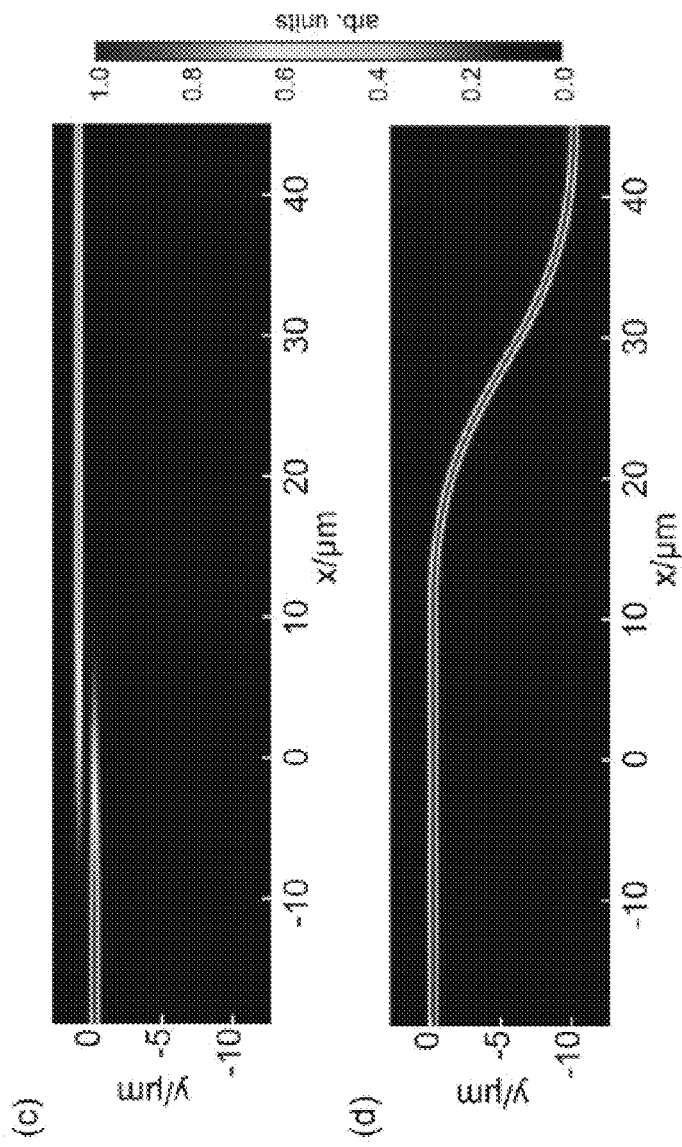
FIGS. 8C and 8D show simulated optical field of the switch shown in FIGS. 8A and 8B when the GSST in the modulation layer is in the amorphous state and the crystalline state, respectively.
Figures 8E, 8F:
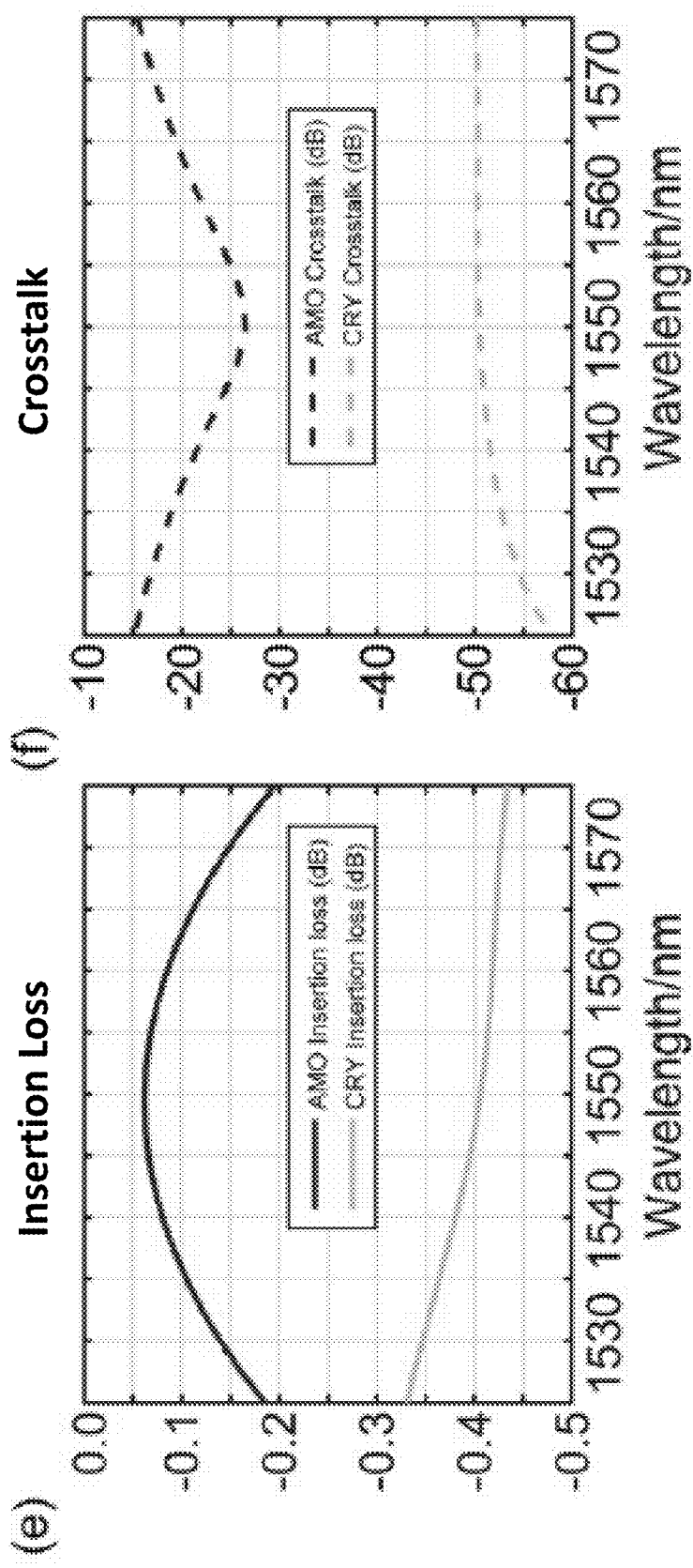
FIGS. 8E and 8F are calculated insertion loss and crosstalk, respectively, of the switch shown in FIGS. 8A and 8B across the telecom C-band.

FIGS. 8C and 8D show simulated optical field in the switch 800 when the GSST in the modulation layer 820 is in the amorphous state and the crystalline state, respectively. FIGS. 8E and 8F are calculated insertion loss and crosstalk, respectively, of the switch 800 across the telecom C-band. Here AMO and CRY stand for amorphous and crystalline states, respectively.

During operation, when the GSST in the modulation layer 820 is amorphous, the phase matching condition between the two waveguides 810a and 810b is met. Accordingly, light launched into the first waveguide 810a (e.g., via the end 815 shown in FIG. 8B) is therefore evanescently coupled and efficiently transferred into the second waveguide 810b, as demonstrated by the intensity profile in FIG. 8C. Despite the large optical field overlap with the modulation layer 820 in this state, the low material attenuation in amorphous GSST facilitates low-loss operation. On the other hand, when the GSST in the modulation layer 820 is in the crystalline state, input light almost exclusively couples into the mode shown in FIG. 7D (i.e., an odd supermode) and remains in the first waveguide 810a. FIG. 8D shows the intensity profile in this case. The minimal optical field interaction with the lossy crystalline GSST layer ensures low insertion loss. The simulated IL and crosstalk (i.e., contrast ratio between the on/off states at the output ports) are plotted in FIGS. 8E and 8F, respectively. At 1550 nm, the 40-µm-long device attains an IL of about 0.4 dB and a CT of over −50 dB for the crystalline state, and an IL as low as 0.06 dB and a CT of −27 dB in the amorphous state.

Figures 9A, 9B:
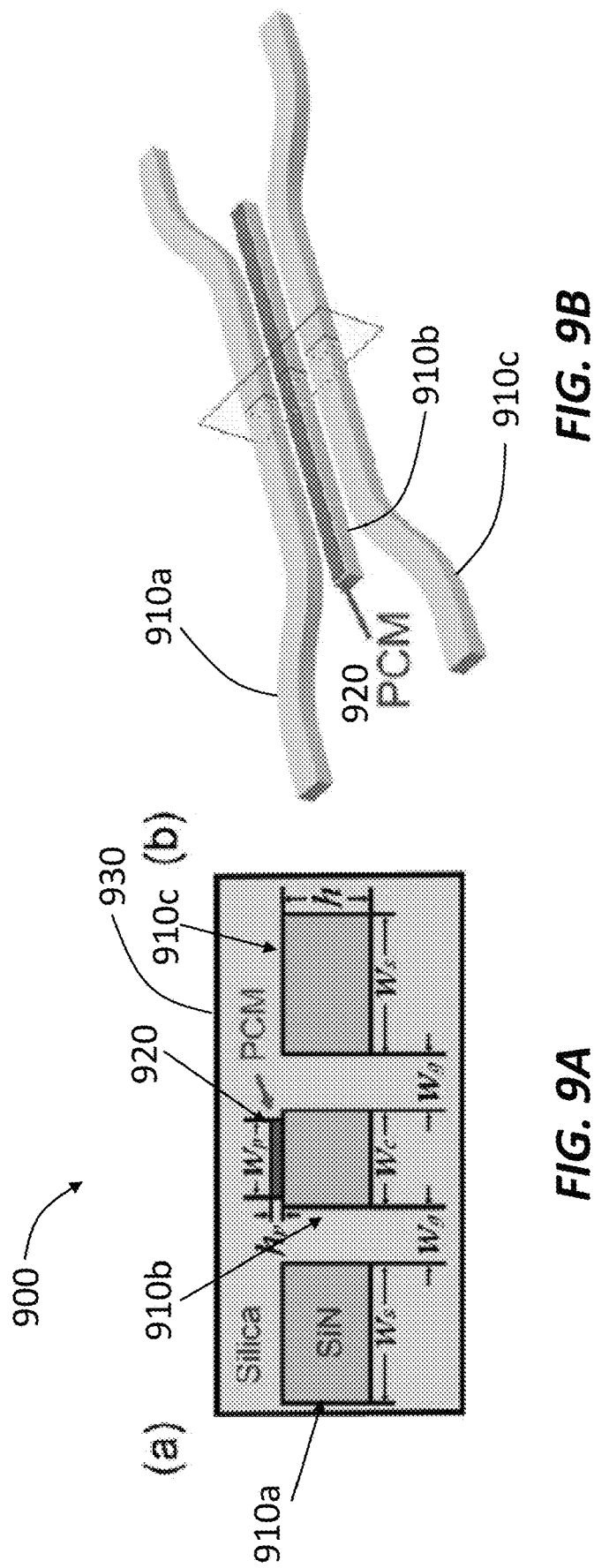
FIGS. 9A and 9B show a cross sectional view and a perspective view, respectively, of a 2×2 optical switch using GSST alloy for light routing.

FIGS. 9A and 9B show a cross sectional view and a perspective view, respectively, of a 2×2 optical switch 900 using GSST alloy for light routing. The switch 900 includes three waveguides 910a, 910b, and 910c. A modulation layer 920 including the GSST alloy described herein is disposed on the second waveguide 910b. An optional cladding 930 can be used to surround the waveguides 910a to 910c. Light beams launched into the switch 900 via either the first waveguide 910a or the third waveguide 910c can be routed out of the switch 900 via either the first waveguide 910a or the third waveguide 910c, depending on the state of the GSST in the modulation layer 920 (illustrated in FIGS. 9C and 9D).

An example set of dimensions of the switch 900 can be as follows. The width $w_c$ of the second waveguide 910b can be about 512 nm. The widths $w_s$ of the first waveguide 910a and the third waveguide 910c can be about 730 nm. The width of the modulation layer $w_p$ can be about 400 nm. The spacing between adjacent waveguides $w_g$ can be about 562 nm. The heights of the three waveguides 910a to 910c can be about 450 nm and the height of the modulation layer 920 can be about 60 nm.

Figures 9C, 9D:
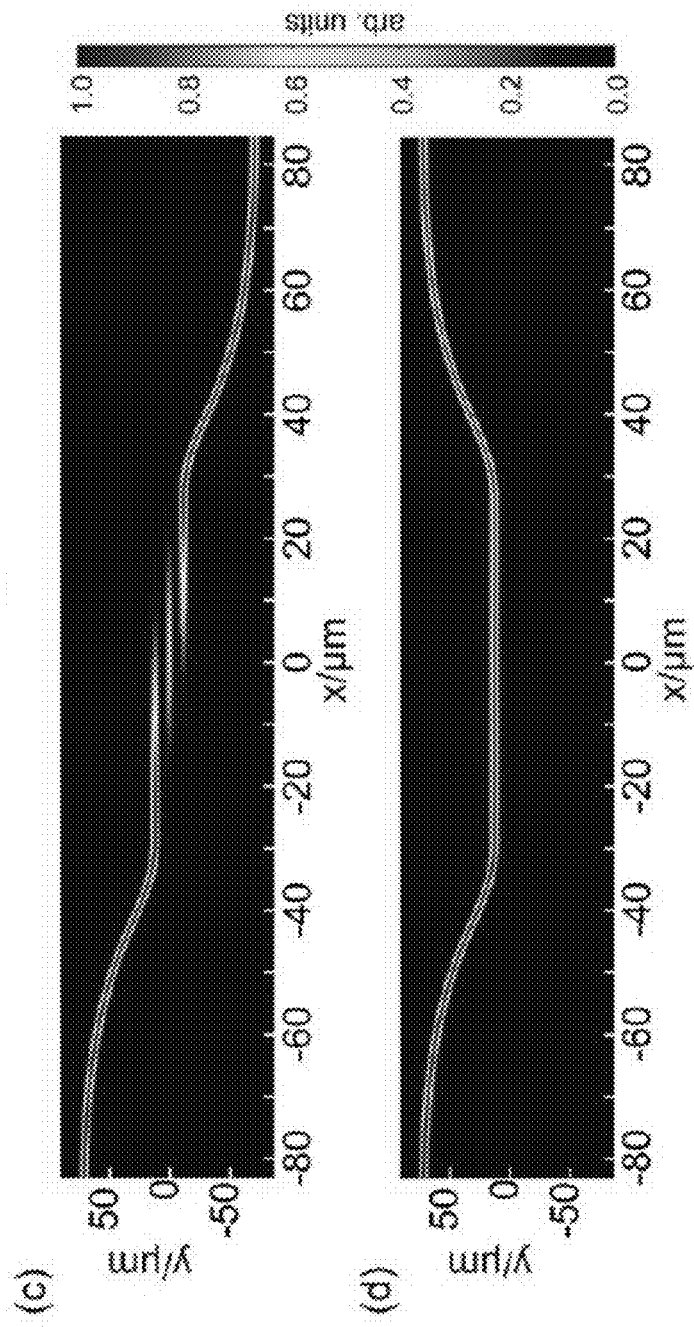
FIGS. 9C and 9D show a simulated optical field of the 2×2 switch shown in FIGS. 9A and 9B when the GSST in the modulation layer is in the amorphous state and the crystalline state, respectively.
Figures 9E, 9F:
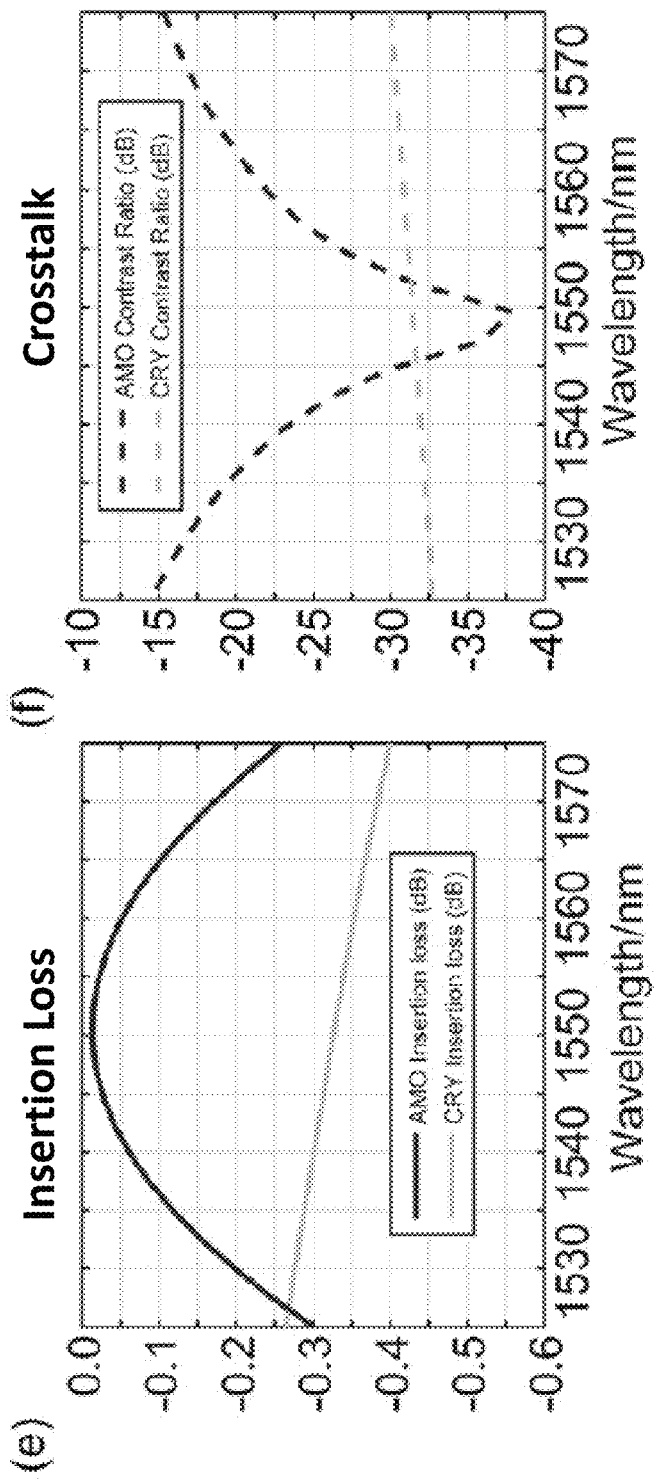
FIGS. 9E and 9F are calculated insertion loss and crosstalk, respectively, of the 2×2 switch shown in FIGS. 9A and 9B across the telecom C-band.

FIGS. 9C and 9D show simulated optical fields in the 2×2 switch 900 shown in FIGS. 9A and 9B when the GSST in the modulation layer 920 is in the amorphous state and the crystalline state, respectively. The simulation uses the dimensions as described above. FIGS. 9E and 9F are calculated insertion loss and crosstalk, respectively, of the 2×2 switch shown in FIGS. 9A and 9B across the telecom C-band.

The working principle of the switch 900 can be illustrated using the supermode theory, where the three supermodes of the three waveguides 910a to 910c are approximated as linear combinations of the normalized individual waveguide modes (labeled as |1⟩, |2⟩, and |3⟩ for the first waveguide 910a, the second waveguide 910b, and the third waveguide 910c, respectively):

$$\frac{1}{2}|1\rangle + \frac{\sqrt{2}}{2}|2\rangle + \frac{1}{2}|3\rangle, \frac{\sqrt{2}}{2}|1\rangle - \frac{\sqrt{2}}{2}|3\rangle, \text{ and} \quad (1)$$
$$-\frac{\sqrt{2}}{2}|2\rangle + \frac{1}{2}|3\rangle$$

It can be shown that complete power transfer (i.e., zero crosstalk) in the cross state (FIG. 9C) can occur when the propagation constants (i.e., wave vectors) of the three supermodes are evenly spaced. In this case, a light beam launched into the switch 900 via the first waveguide 910a is first coupled into the second waveguide 910b and then to the third waveguide 910c, where the light beam is coupled out of the switch 900. In FIG. 9D, when the GSST is in the crystalline state, a light beam launched into the switch 900 via the first waveguide 910a continues to propagate within the first waveguide 910a.

The switch 900 also exhibits broadband switching capability across the C-band as illustrated in FIGS. 9E and 9F. At 1550 nm, the ILs for the cross and bar states are 0.013 and 0.32 dB, and the CTs for the two states are −37 and −32 dB, respectively. These figures represent, to the best of the inventors' knowledge, the best performance for nonvolatile on-chip optical switches.

To elucidate the respective contributions to this exceptional performance from: (1) substitution of GST with GSST; and (2) the non-perturbative configurations of the switches 800 and 900, simulations were performed based on a GST alloy as well as a traditional MZI design. In the MZIs, one of the interferometer arms is loaded with a thin layer of PCM to induce a π phase shift upon crystallization. The power splitting ratios in the arms are chosen to balance the MZI arms when the PCM is in the amorphous state, which can maximize the CT. However, when the PCM is crystallized, its increased absorption results in power imbalance between the arms, compromising both the CT and IL. It can be shown that performance of MZI switches is defined by the classical FOM. Results in Table 1, which indicate that the combination of the GSST material and the non-perturbative configuration reaches the performance target, highlight the contribution from both material properties and the device configuration.

TABLE 1

Performance Comparison between Different 2 × 2 Switch Designs

|  | Traditional MZI | | Nonperturbative Design | |
| --- | --- | --- | --- | --- |
|  | GST | GSST | GST | GSST |
| IL (dB) | 8.6 | 3.5 | 2.5 | 0.32 |
| CT (dB) | −0.02 | −6.1 | −20 | −32 |

Figure 10A:
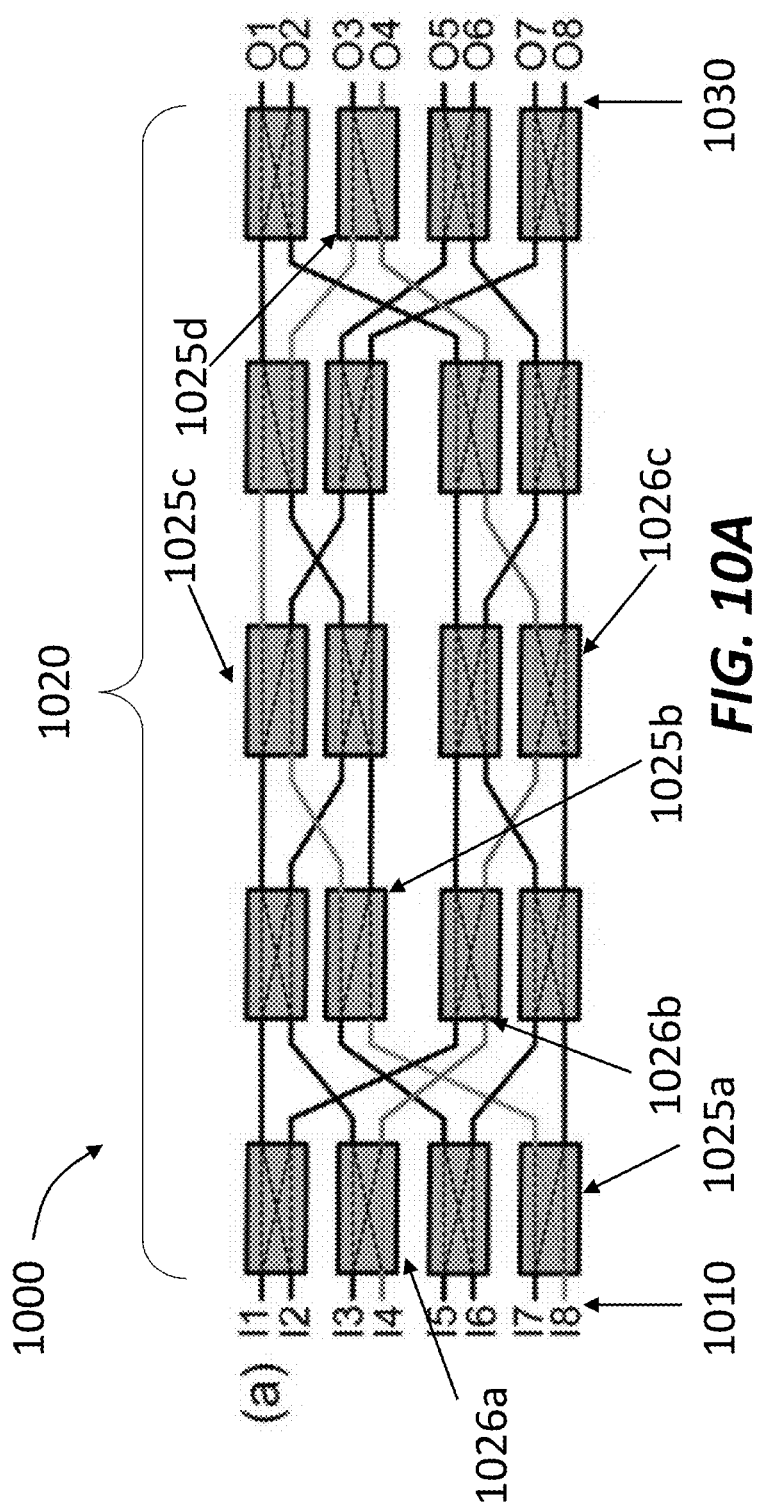
FIG. 10A shows a schematic of an 8×8 Benes network based on nonvolatile switches using GSST alloy.
Figure 10B:
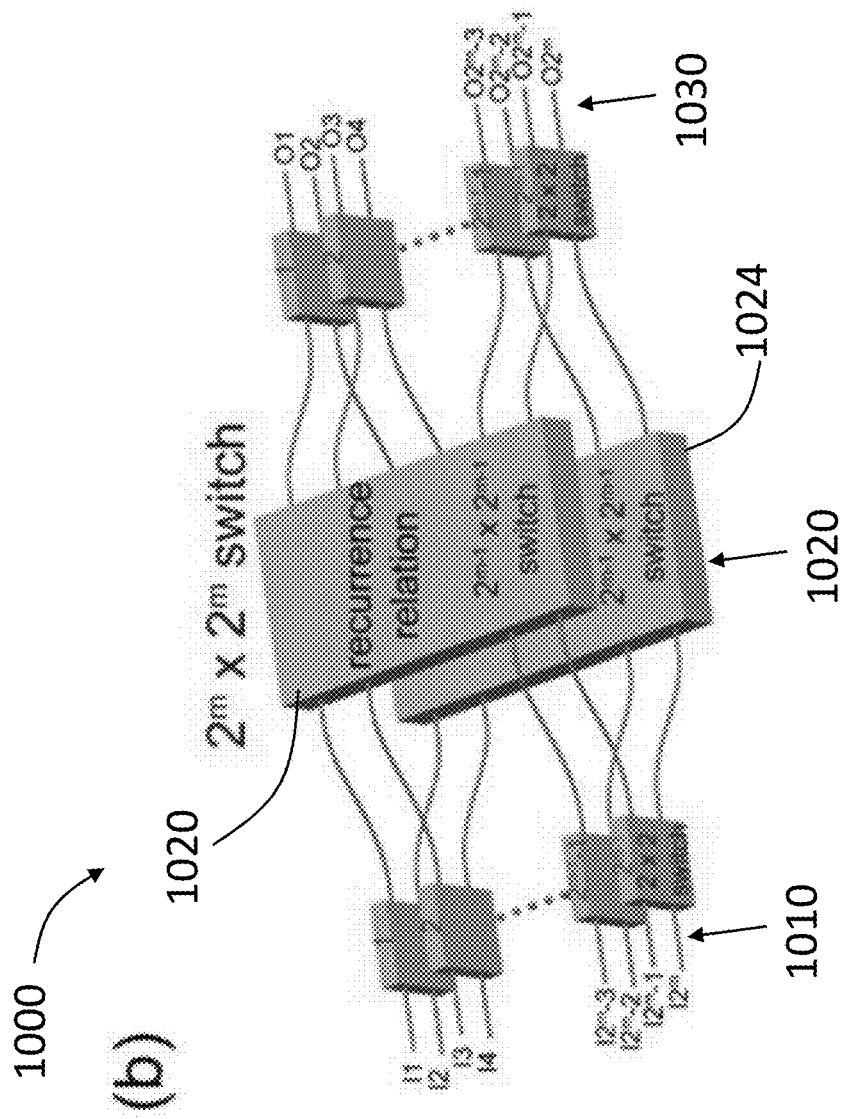
FIG. 10B shows a schematic of a $2^m \times 2^m$ Benes network 1000 illustrating the recurrence relation between a $2^m \times 2^m$ switch and $2^{m-1} \times 2^{m-1}$ switch.
Figure 10C:
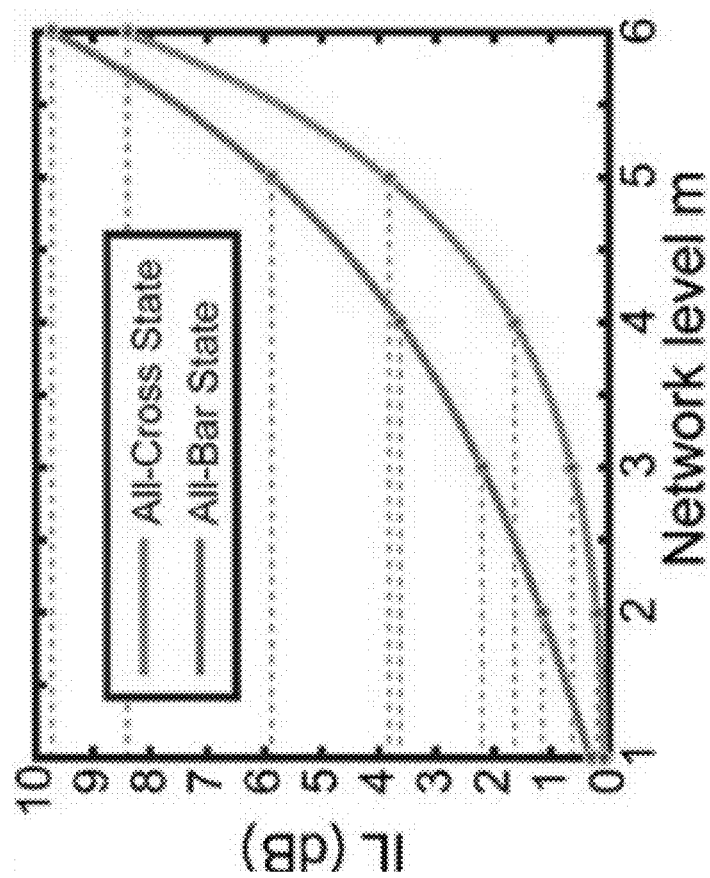
FIG. 10C shows the all-bar and all-cross insertion losses versus the network level m in the $2^m \times 2^m$ Benes network shown in FIG. 10B.

FIG. 10A shows a schematic of an 8×8 Benes network 1000 based on nonvolatile switches (e.g., switches 900 shown in FIGS. 9A and 9B). The network 1000 includes 8 input waveguides 1010 to deliver input light beams into a network of interconnected 2×2 switches 1020 and 8 output waveguides to deliver the output beams. FIG. 10B shows a schematic of the network 1000 extended to a dimension of $2^m \times 2^m$, illustrating the recurrence relation between a $2^m \times 2^m$ switch and $2^{m-1} \times 2^{m-1}$ switch. In this case, the network of switches 1020 includes a first group of $2^{m-1} \times 2^{m-1}$ switches 1022 to receive half of the input light beams and a second group of $2^{m-1} \times 2^{m-1}$ switches 1024 to receive the other half of the input light beams. The level-m switch shown in FIG. 10B includes two level-(m−1) switches i.e., 1022 and 1024 and $2^m$ 2×2 switches. FIG. 10C shows calculated insertion losses of the switch at 1550 nm. The all-cross state corresponds to $I2^{m-1}$-$O^{2m-1}$ (the route along I8-1025a-1025b-1025c-1025d-O3 marked in FIG. 10A for the 8×8 case). The all-bar state is the $I^{2m-1}$-$O^{2m-1}$ path (the route along I4-1026a-1026b-1026c-1025d-O4 marked in FIG. 10A).

The network 1000 uses the 2×2 switch as a building block and can be scaled to realize arbitrary network complexity levels. As an example, FIG. 10A depicts the block diagram for an 8×8 switch, and FIG. 10B illustrates the generic scaling law to construct a $2^m \times 2^m$ switch. Generally, a $2^m \times 2^m$ switch includes of $2^{m-1}$ rows and $2^{m-1}$ columns of 2×2 switches. Therefore, light passes through a total of $2^{m-1} 2 \times 2$ switches in the fabric.

The IL of the entire network can be computed by considering ILs from individual 2×2 switches on the optical path as well as loss due to waveguide crossings. The IL of a waveguide crossing is taken as 0.1 dB, which has been experimentally realized in the C-band. Because the 2×2 switch element has higher IL in the bar state (see, e.g., FIG. 9E), the ILs of all-bar and all-cross states approximately correspond to the upper and lower bounds of the network IL. As used herein, all-bar state means all of the 2×2 switch states in a light path bar-state and all-cross state means all of the 2×2 switch states in a light path are cross-state. For the all-bar state, $I^{2m-1}$-$O^{2m-1}$ represents a lossy path with a large number of crossings. The IL for this path is:

$$(2^m - 2) \times 0.1 \text{ dB} + 2m - 1 \times 0.32 \text{ dB} \quad (2)$$

An exemplary all-cross state path is $I^{2m}$-$O^{2m-1}$ and the corresponding IL is:

$$(3 \times 2^{m-1} - 1 - 2m) \times 0.1 \text{ dB} + (2m-1) \times 0.013 \text{ dB} \quad (3)$$

This IL is dominated by the waveguide crossing loss. The CT, defined as the ratio of transmitted power from the target output port over the maximum leaked power from a "non-target" port, is estimated using the following formula at 1550 nm for a $2^m \times 2^m$ switch:

$$-(32 \text{ dB} - 10 \cdot \log_{10} m \text{ dB}) \quad (4)$$

where −32 dB is the "worst-case" (bar state) CT for a 2×2 switch, and the second factor adds up leaked power from each switch stage.

FIG. 10C shows the all-bar and all-cross ILs versus the network level m following Equations (2) and (3). In a 16×16 switch, the ILs for all-cross and all-bar states are 1.6 and 3.6 dB, respectively, and the ILs in a 32×32 switch are 3.9 and 5.9 dB. The CTs for a 16×16 switch and a 32×32 switch are −26 and −25 dB, respectively. These figures represent a significant improvement compared to state-of-the-art (volatile) on-chip switches. For example, for 16×16 switches, the reported ILs are 6.7 and 14 dB, and the CT is −15.1 dB. The corresponding ILs are 12.9 and 16.5 dB in 32×32 switches, and the CT is approximately −15 dB.

Figure 11B:
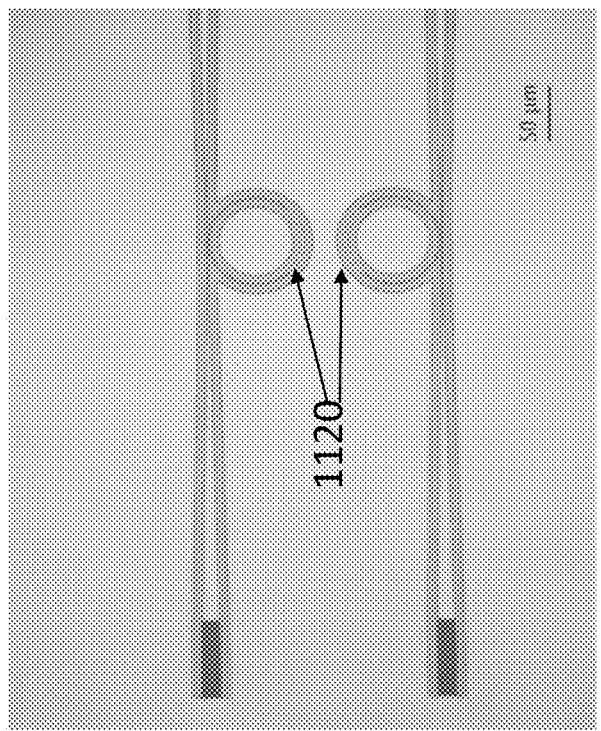
FIG. 11B is a microscope image of two modulators similar to the modulator shown in FIG. 11A.
Figure 11A:
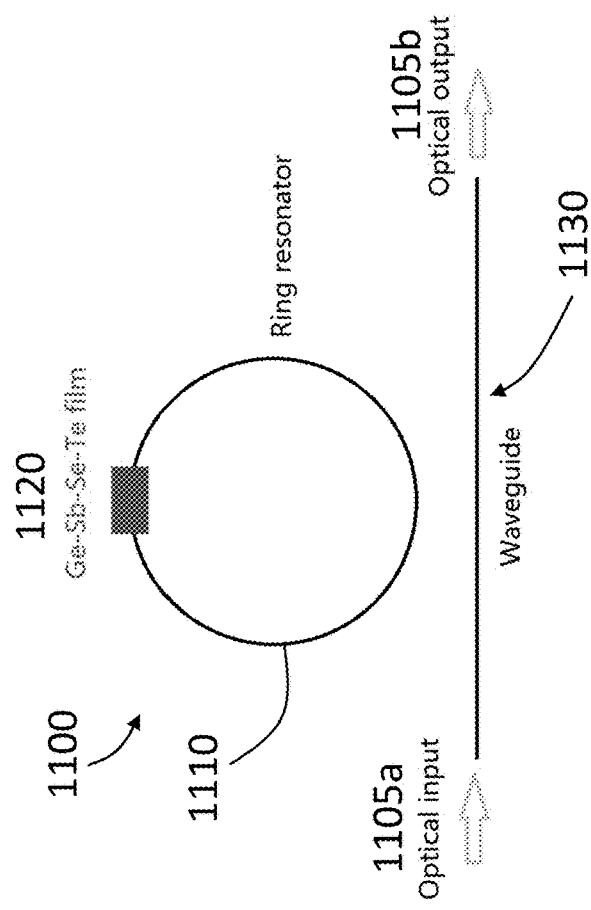
FIG. 11A shows a schematic of a modulator including a ring resonator and a modulation layer made of a GSST alloy.
Figure 11C:
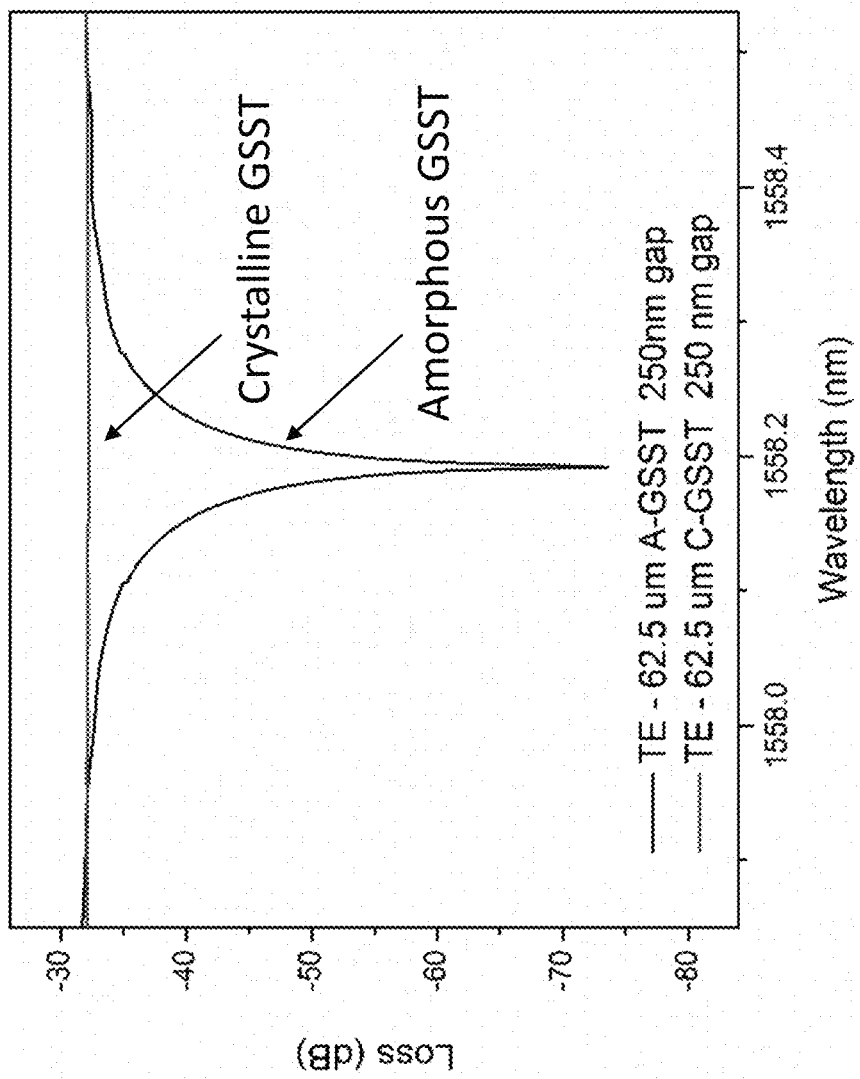
FIG. 11C shows transmission spectra of the modulator shown in FIG. 11A when the GSST is in the crystalline state and the amorphous state.

FIG. 11A shows a schematic of a modulator 1100 including a ring resonator 1110 and a modulation layer 1120 made of the GSST alloy described herein. The modulator 1100 also includes a waveguide 1130 evanescently coupled to the ring resonator 1110, which is employed to couple optical input 1105a into the ring resonator 1110 and couple optical output 1105b out of the ring resonator 1110. FIG. 11B is a microscope image of two modulators similar to the modulator shown in FIG. 11A. the modulator 1100 shown in FIG. 11A. FIG. 11C shows the transmission spectra of the modulator when the GSST material is in its crystalline state and amorphous state.

During operation, the optical mode in the waveguide 1130 and the ring resonator 1110 is coupled into the modulation layer 1120. Therefore, the change in the refractive index and extinction ratio of the modulation layer 1120 can affect the relative mode property. As illustrated in FIG. 11C, when the GSST (e.g., $Ge_2Sb_2Se_4Te_1$) is in the amorphous state, the modulator is turned ON, i.e., the optical mode is in resonance with the ring resonator 1110 so the transmission of light at the resonant wavelength (about 1558.2 nm) is low. When the GSST is crystallized (i.e., the modulator is turned OFF), the optical loss in the material dominates the round trip loss in the ring resonator, the dip in the transmission spectrum disappears and the modulator 1100 behaves like a waveguide that passes the light beam. FIG. 11C also shows that the ratio of the output power at the resonant wavelength when the modulator is ON and OFF can be substantially equal to or greater than −40 dB.

Figure 12:
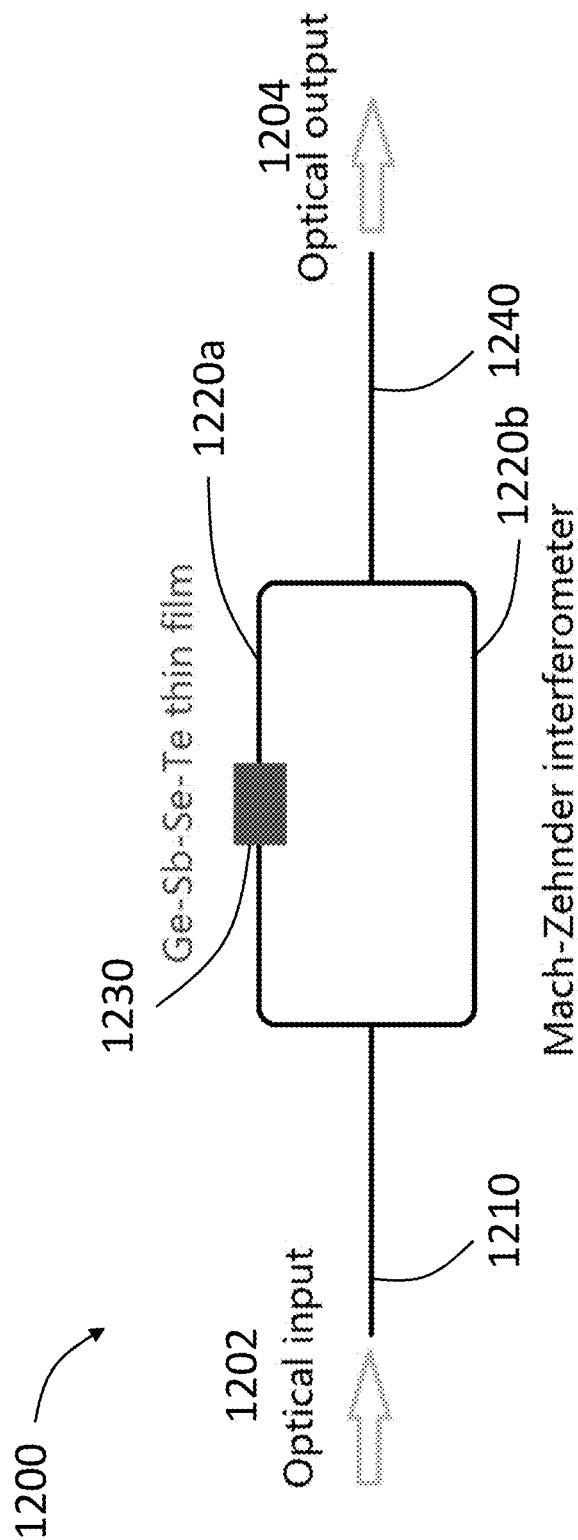
FIG. 12 shows a schematic of an interferometer using GSST alloy for phase modulation.

FIG. 12 shows a schematic of an interferometer 1200 using GSST alloy for phase modulation. The interferometer 1200 includes an input waveguide 1210 to receive optical input 1202, which is then split into two arms 1220a and 1220b. A modulation layer 1230 made of the GSST alloy described herein is disposed on the first arm 1220a to introduce a phase shift in the light propagating in the first arm 1220a. The interferometer 1200 also includes an output waveguide 1240 to deliver the optical output 1204, which is generated via interference of the light beams delivered by the two arms 1220a and 1220b. Switching the GSST in the modulation layer 1230 can introduce a phase shift between the light beams, thereby changing the interference at the output waveguide 1240. For example, when the GSST is in the amorphous state, the two light beams out of the two arms 1220a and 1220b can constructively interfere with each other. When the GSST is in the crystalline state, the two light beams out of the two arms 1220a and 1220b can destructively interfere with each other.

Figure 13:
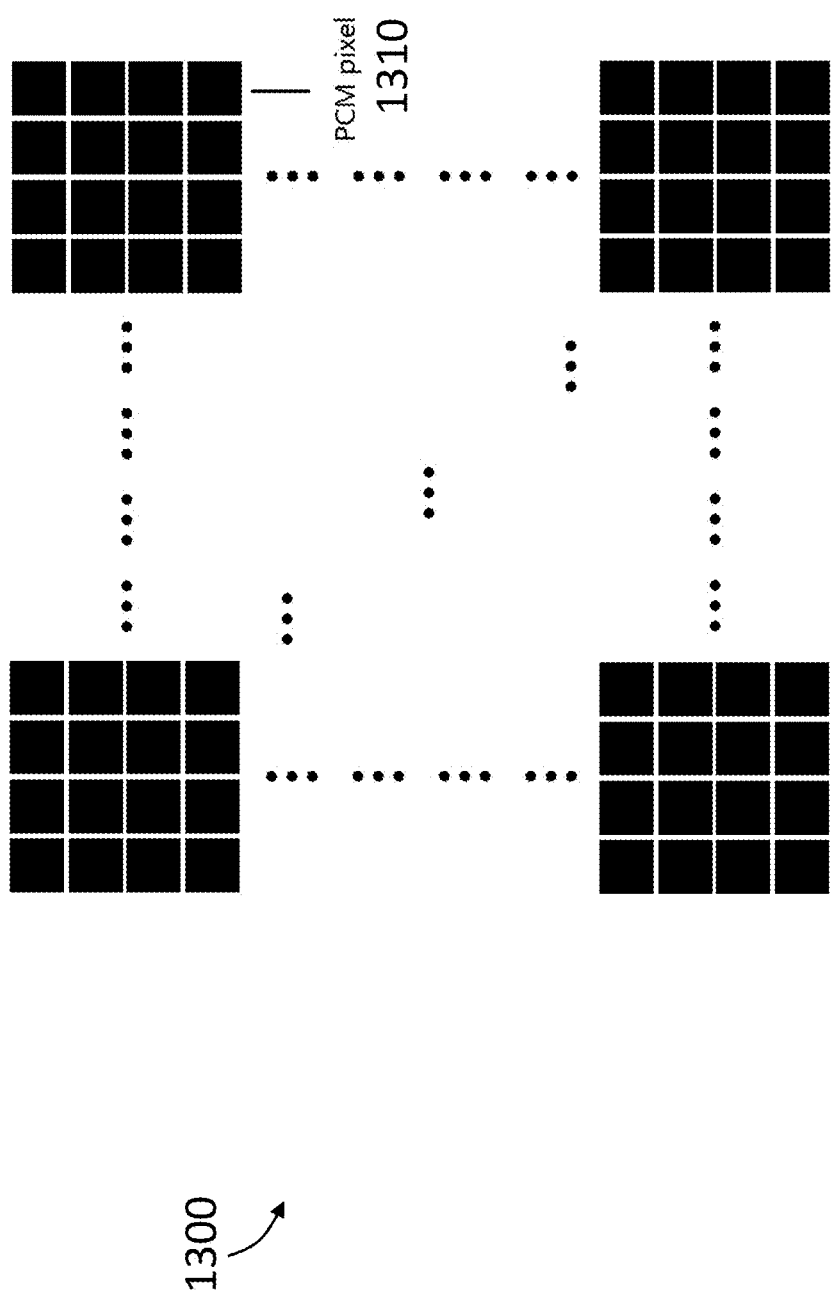
FIG. 13 shows a schematic of a pixel array integrated with a GSST alloy for light modulation.

FIG. 13 shows a schematic of a pixel array 1300 integrated with a GSST alloy for spatial light modulation. In this array 1300, each pixel 1310 can be coated with a layer of GSST, which can be used to tune the reflectance, transmittance, or spectral response of the pixel 1310. The reflectance/transmittance or spectral response of the pixel depends on the absorption or resonance behavior of the GSST layer. Therefore, by changing the state of GSST, the absorption or the resonance behavior will be changed, thus the reflectance/transmittance or spectral response of the pixel can be tunable.

Methods of Manufacturing GSST Alloy and Depositing GSST Films

Figures 14A, 14B, 14C, 14D:
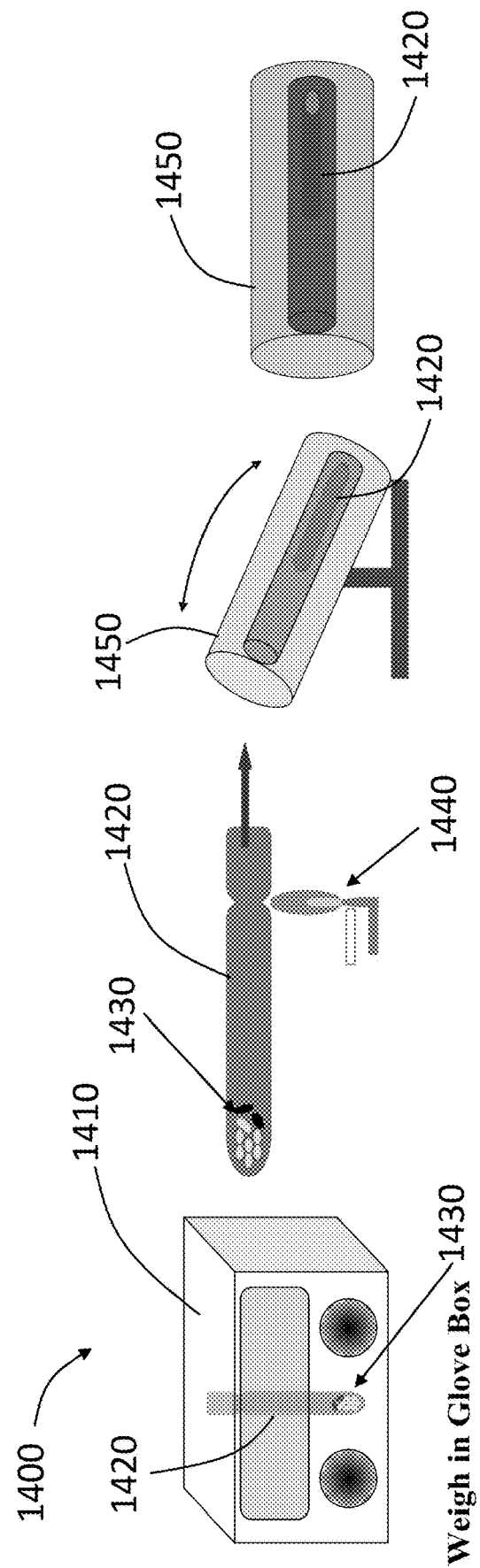
FIGS. 14A-14D illustrate a method of manufacturing GSST alloys.

FIGS. 14A-14D illustrate a method 1400 of manufacturing GSST alloys described herein. In this method 1400, an initial composition 1430 is placed into a container 1420 (e.g., a tube), which is put in a glove box 1410, as illustrated in FIG. 14A. The initial composition 1430 includes the elements Ge, Sb, Se, and Te with the proper atomic percentages of each element (e.g., the compositions described with reference to FIG. 1A). In one example, the initial composition 1430 can include a GST alloy and Se to replace some of the Te by Se. In another example, the initial composition 1430 can include GST and GeSbSe.

FIG. 14B shows that vacuum condition is created in the container 1420 containing the initial composition 1430 to drive out water vapor, followed by sealing of the container 1420 (e.g., using a torch). In FIG. 14C, the container 1420 is placed into a furnace 1450 (e.g., a rocking furnace) to melt the composition in the container. Is this process, the initial composition 1430 is melted down so as to form a GSST alloy. The swinging of the furnace 1450 can increase the composition uniformity after melting. The resulting alloy is then quenched down to room temperature, as shown in FIG. 14D. The manufactured GSST alloy is in bulk form and can be ground into powder that can be used as the deposition source for thermal evaporation (see FIG. 15 below).

Figure 15:
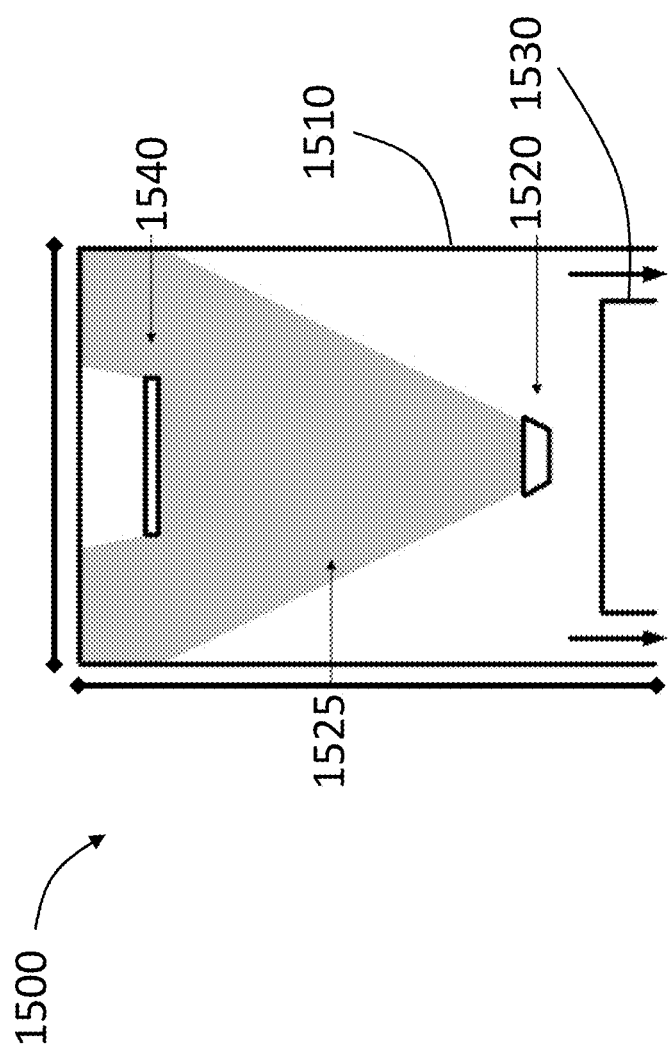
FIG. 15 shows a schematic of a system to fabricate GSST films via thermal deposition.

FIG. 15 shows a schematic of a system 1500 to fabricate a GSST film via thermal deposition. The system 1500 includes a vacuum chamber 1510. A source 1520 including GSST (e.g., GSST powder manufactured via the method 1400 illustrated in FIGS. 14A-14D) is placed in the vacuum chamber 1510 and in thermal communication with a heat source 1530. The heat source 1530 heats up the source 1520, causing the GSST material to evaporate and form a GSST flow 1525. A target substrate 1540 is placed above the source 1520 and in the path of the GSST flow 1525. Atoms of GSST in the GSST flow 1525 are deposited on the target substrate 1540 to form a GSST thin film. The distance between the source 1520 and the target substrate 1540 can be, for example, about 200 mm to about 1 meter. Due to the vacuum condition and the relatively low temperature used in thermal evaporation, the resulting GSST film is usually in the amorphous state and can be switched to the crystalline state by an annealing process described above (e.g., with reference to FIG. 6).

Figure 16:
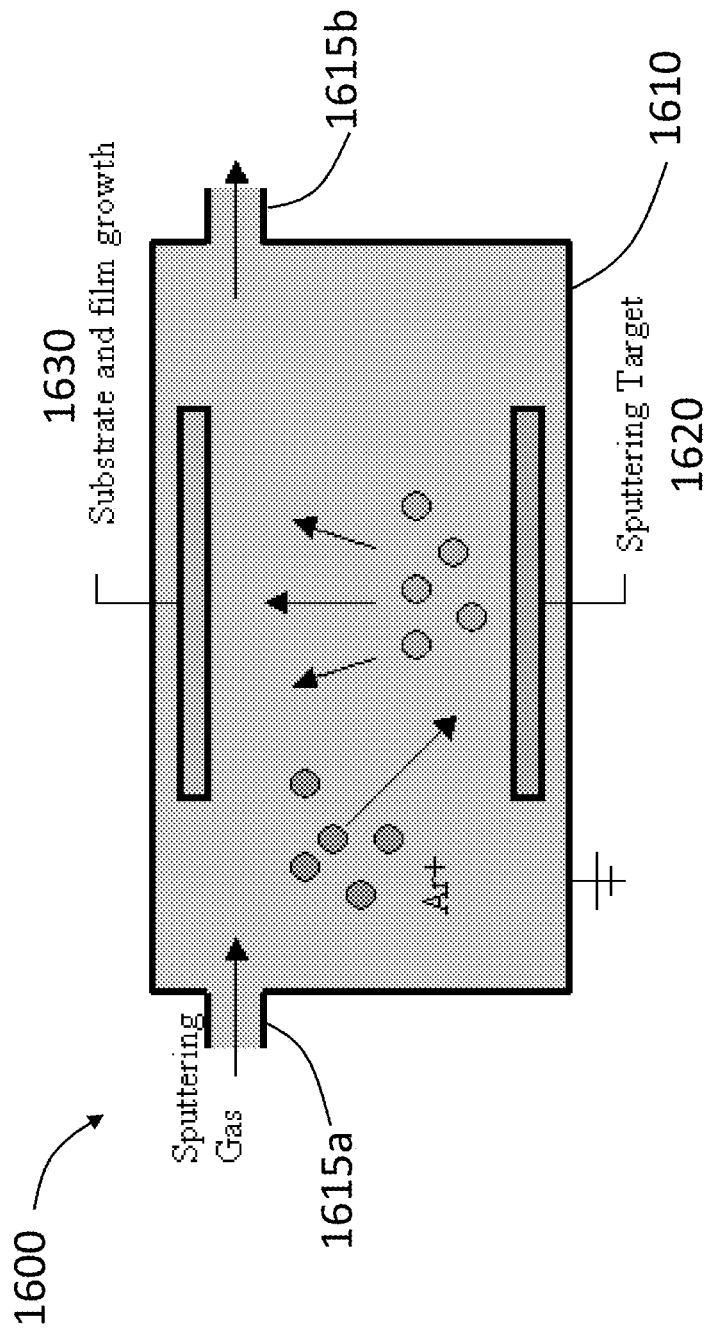
FIG. 16 shows a schematic of a system to fabricate GSST film via sputtering.

FIG. 16 shows a system 1600 to fabricate GSST thin films via sputtering. The system 1600 includes a chamber 1610 holding a sputtering target 1620, which can be a single GSST target or multiple targets, such as Ge, Sb, Se and Te, or GeSbTe and GeSbSe. The chamber 1610 includes an input port 1615a to receive sputtering gas (e.g., Argon) to create ions (e.g., $Ar^+$ ions) that can eject out atoms in the sputtering target 1620 via bombardment. The ejected atoms then land on a substrate 1630 disposed above the sputtering target 1620 to form a GSST thin film.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method comprising:
heating a $Ge_xSb_ySe_zTe_m$ alloy in an amorphous phase with a heating element in thermal communication with the $Ge_xSb_ySe_zTe_m$ alloy to a first temperature, the heating causing the $Ge_xSb_ySe_zTe_m$ alloy to transition from the amorphous phase to a crystalline phase;
heating the $Ge_xSb_ySe_zTe_m$ alloy in the crystalline phase with the heating element to a second temperature higher than the first temperature; and
cooling the $Ge_xSb_ySe_zTe_m$ alloy from the second temperature to a third temperature lower than the second temperature, the heating to the second temperature and the cooling to the third temperature causing the $Ge_xSb_ySe_zTe_m$ alloy to transition from the crystalline phase to the amorphous phase,
wherein x+y is 0.4 to 0.5, z is 0.1 to 0.54, and x+y+z+m=1.

2. The method of claim 1, wherein the first temperature is greater than a phase transition temperature of the $Ge_xSb_ySe_zTe_m$ alloy and less than 100 degrees Celsius above the phase transition temperature.

3. The method of claim 1, wherein the first temperature is between 200 degrees Celsius and 350 degrees Celsius.

4. The method of claim 1, wherein the second temperature is higher than a melting temperature of the $Ge_xSb_ySe_zTe_m$ alloy.

5. The method of claim 1, wherein the heating element comprises at least one of a heater or a laser.

6. The method of claim 1, wherein cooling the $Ge_xSb_ySe_zTe_m$ alloy from the second temperature to the third temperature is at a cooling rate of at least $10^5$ degrees Celsius per second.

7. The method of claim 1, wherein the crystalline phase contains vacancies randomly distributed within the crystalline phase with an atomic density from 0.5% to 20%.

8. The method of claim 1, wherein the transition of the $Ge_xSb_ySe_zTe_m$ alloy from the amorphous phase to the crystalline phase causes a refractive index of the $Ge_xSb_ySe_zTe_m$ alloy to change by more than 1 over a spectral range greater than 1000 nm.

9. The method of claim 1, further comprising heating the $Ge_xSb_ySe_zTe_m$ alloy in the crystalline phase to a fourth temperature higher than the first temperature and lower than the second temperature, the heating to the fourth temperature causing vacancies in the $Ge_xSb_ySe_zTe_m$ alloy to transition from a random distribution to an ordered distribution.

10. An apparatus comprising:
a $Ge_xSb_ySe_zTe_m$ alloy, the $Ge_xSb_ySe_zTe_m$ alloy being reversibly switchable between an amorphous phase and a crystalline phase; and
a heating element, in thermal communication with the $Ge_xSb_ySe_zTe_m$ alloy, to heat the $Ge_xSb_ySe_zTe_m$ alloy in the amorphous phase to a first temperature, thereby causing the $Ge_xSb_ySe_zTe_m$ alloy to transition from the amorphous phase to the crystalline phase, and to heat the $Ge_xSb_ySe_zTe_m$ alloy in the crystalline phase to a second temperature higher than the first temperature and to allow the $Ge_xSb_ySe_zTe_m$ alloy to cool to a third temperature lower than the second temperature, thereby causing the $Ge_xSb_ySe_zTe_m$ alloy to transition from the crystalline phase to the amorphous phase,
wherein x+y is 0.4 to 0.5, z is 0.1 to 0.54, and x+y+z+m=1.

11. The apparatus of claim 10, wherein the heating element is at least one of a heater configured to heat the $Ge_xSb_ySe_zTe_m$ alloy or a laser configured to illuminate the $Ge_xSb_ySe_zTe_m$ alloy with a laser pulse.

12. The apparatus of claim 10, wherein the crystalline phase contains vacancies randomly distributed within the crystalline phase with an atomic density of 0.5% to 20%.

13. The apparatus of claim 12, wherein heating the $Ge_xSb_ySe_zTe_m$ alloy in the crystalline phase to a temperature greater than 100 degrees Celsius above a phase transition temperature causes the vacancies to be distributed in an ordered arrangement within the crystalline phase.

14. The apparatus of claim 10, wherein the refractive index of the $Ge_xSb_ySe_zTe_m$ alloy in the crystalline phase is greater than the refractive index of the $Ge_xSb_ySe_zTe_m$ alloy in the amorphous phase by at least 1 over a spectral range greater than 1000 nm.

15. The apparatus of claim 10, wherein the thickness of the $Ge_xSb_ySe_zTe_m$ alloy is substantially 1 mm or less.

16. The apparatus of claim 10, wherein the $Ge_xSb_ySe_zTe_m$ alloy is deposited on a first optical waveguide configured to guide light when the $Ge_xSb_ySe_zTe_m$ alloy is in one of the amorphous phase and the crystalline phase.

17. The apparatus of claim 16, further comprising:
a second optical waveguide, in evanescent communication with the first optical waveguide, to receive light from the first optical waveguide when the $Ge_xSb_ySe_zTe_m$ alloy is in the other of the amorphous phase and the crystalline phase.

18. The apparatus of claim 10, wherein the first temperature is greater than a phase transition temperature of the $Ge_xSb_ySe_zTe_m$ alloy and less than 100° C. greater than the phase transition temperature of the $Ge_xSb_ySe_zTe_m$ alloy, and the second temperature is greater than 100° C. above the phase transition temperature of the $Ge_xSb_ySe_zTe_m$ alloy.

19. The apparatus of claim 10, wherein the second temperature is greater than 450° C.

20. The apparatus of claim 10, wherein the second temperature is greater than 600° C.

21. An apparatus comprising:
a $Ge_xSb_ySe_zTe_m$ alloy, the $Ge_xSb_ySe_zTe_m$ alloy being reversibly switchable between an amorphous phase and a crystalline phase; and
a heating element, in thermal communication with the $Ge_xSb_ySe_zTe_m$ alloy, to heat the $Ge_xSb_ySe_zTe_m$ alloy in the amorphous phase to a first temperature, thereby causing the $Ge_xSb_ySe_zTe_m$ alloy to transition from the amorphous phase to the crystalline phase, and to heat the $Ge_xSb_ySe_zTe_m$ alloy in the crystalline phase to a second temperature higher than the first temperature and to allow the $Ge_xSb_ySe_zTe_m$ alloy to cool to a third temperature lower than the second temperature, thereby causing the $Ge_xSb_ySe_zTe_m$ alloy to transition from the crystalline phase to the amorphous phase,
wherein x is 0 to 0.15, y is 0.5 to 0.68, z is 0.05 to 0.3, and x+y+z+m=1.

22. An apparatus comprising:
a $Ge_xSb_ySe_zTe_m$ alloy, the $Ge_xSb_ySe_zTe_m$ alloy being reversibly switchable between an amorphous phase and a crystalline phase; and
a heating element, in thermal communication with the $Ge_xSb_ySe_zTe_m$ alloy, to heat the $Ge_xSb_ySe_zTe_m$ alloy in the amorphous phase to a first temperature, thereby causing the $Ge_xSb_ySe_zTe_m$ alloy to transition from the amorphous phase to the crystalline phase, and to heat the $Ge_xSb_ySe_zTe_m$ alloy in the crystalline phase to a second temperature higher than the first temperature and to allow the $Ge_xSb_ySe_zTe_m$ alloy to cool to a third temperature lower than the second temperature, thereby causing the $Ge_xSb_ySe_zTe_m$ alloy to transition from the crystalline phase to the amorphous phase,
wherein x+y is 0.4 to 0.5, z is 0.4 to 0.54, and x+y+z+m=1.

23. An apparatus comprising:
a $Ge_xSb_ySe_zTe_m$ alloy, the $Ge_xSb_ySe_zTe_m$ alloy being reversibly switchable between an amorphous phase and a crystalline phase; and
a heating element, in thermal communication with the $Ge_xSb_ySe_zTe_m$ alloy, to heat the $Ge_xSb_ySe_zTe_m$ alloy in the amorphous phase to a first temperature, thereby causing the $Ge_xSb_ySe_zTe_m$ alloy to transition from the amorphous phase to the crystalline phase, and to heat the $Ge_xSb_ySe_zTe_m$ alloy in the crystalline phase to a second temperature higher than the first temperature and to allow the $Ge_xSb_ySe_zTe_m$ alloy to cool to a third temperature lower than the second temperature, thereby causing the $Ge_xSb_ySe_zTe_m$ alloy to transition from the crystalline phase to the amorphous phase,
wherein x is 0.2, y is 0.2, z is 0.4 to 0.5, and x+y+z+m=1.

24. An apparatus comprising:
a $Ge_xSb_ySe_zTe_m$ alloy, x+y being about 0.4 to about 0.5, z being about 0.1 to 0.54, and x y z m=1, the $Ge_xSb_ySe_zTe_m$ alloy being reversibly switchable between an amorphous phase and a crystalline phase; and
a heating element, in thermal communication with the $Ge_xSb_ySe_zTe_m$ alloy, to heat the $Ge_xSb_ySe_zTe_m$ alloy in the amorphous phase to a first temperature greater than a phase transition temperature and less than 100° C. higher than the phase transition temperature, thereby causing the $Ge_xSb_ySe_zTe_m$ alloy to transition from the amorphous phase to the crystalline phase, and to heat the $Ge_xSb_ySe_zTe_m$ alloy in the crystalline phase to a second temperature higher than the first temperature and greater than 450° C. and to allow the $Ge_xSb_ySe_zTe_m$ alloy to cool to a third temperature lower than the second temperature, thereby causing the $Ge_xSb_ySe_zTe_m$ alloy to transition from the crystalline phase to the amorphous phase, wherein the refractive index of the $Ge_xSb_ySe_zTe_m$ alloy in the crystalline phase is greater than the refractive index of the $Ge_xSb_ySe_zTe_m$ alloy in the amorphous phase by at least 1 over a spectral range greater than 1000 nm.

25. The apparatus of claim 24, wherein z is 0.4 to 0.54.

26. The apparatus of claim 24, wherein x is 0.22, y is 0.22, and z is 0.4 to about 0.5.

27. The apparatus of claim 24, wherein the heating element is a laser.

\* \* \* \* \*

UNITED STATES PATENT AND TRADEMARK OFFICE
CERTIFICATE OF CORRECTION

PATENT NO. : 11,231,603 B2
APPLICATION NO. : 16/826489
DATED : January 25, 2022
INVENTOR(S) : Zhuoran Fang et al.

It is certified that error appears in the above-identified patent and that said Letters Patent is hereby corrected as shown below:

In the Claims

• Column 18 In Claim 24, Line 63, replace "and x y z m=1" with -- and $x + y + z + m = 1$ --

Signed and Sealed this
Twenty-fourth Day of May, 2022

Katherine Kelly Vidal
*Director of the United States Patent and Trademark Office*